United States Patent
Katsumata et al.

(10) Patent No.: US 7,558,141 B2
(45) Date of Patent: Jul. 7, 2009

(54) MEMORY SYSTEM, SEMICONDUCTOR MEMORY DEVICE AND METHOD OF DRIVING SAME

(75) Inventors: Ryota Katsumata, Yokohama (JP); Masaru Kidoh, Kawasaki (JP); Hiroyasu Tanaka, Tokyo (JP); Masaru Kito, Yokohama (JP); Hideaki Aochi, Kawasaki (JP); Yoshiaki Fukuzumi, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 11/955,900

(22) Filed: Dec. 13, 2007

(65) Prior Publication Data

US 2008/0180994 A1  Jul. 31, 2008

(30) Foreign Application Priority Data

Jan. 5, 2007  (JP) ............................. 2007-000745

(51) Int. Cl.
*G11C 7/14* (2006.01)
(52) U.S. Cl. .............................. 365/210.1; 365/185.02; 365/185.2; 365/185.23
(58) Field of Classification Search ............. 365/210.15
See application file for complete search history.

(56) References Cited

U.S. PATENT DOCUMENTS

| 5,308,778 | A | 5/1994 | Fitch et al. |
| 5,612,563 | A | 3/1997 | Fitch et al. |
| 5,990,509 | A | 11/1999 | Burns, Jr. et al. |
| 6,727,544 | B2 | 4/2004 | Endoh et al. |
| 6,870,215 | B2 | 3/2005 | Endoh et al. |
| 7,310,280 | B2 * | 12/2007 | Park et al. ................. 365/210.1 |
| 2007/0236979 | A1 * | 10/2007 | Takashima .................. 365/145 |
| 2008/0007999 | A1 * | 1/2008 | Park et al. .............. 365/185.02 |
| 2008/0144378 | A1 * | 6/2008 | Park et al. .............. 365/185.05 |

OTHER PUBLICATIONS

U.S. Appl. No. 10/874,004, filed Oct. 17, 2007, Kito et al.
U.S. Appl. No. 12/021,003, filed Jan. 28, 2008, Enda et al.
U.S. Appl. No. 12/140,734, filed Jun. 17, 2008, Kito et al.
U.S. Appl. No. 12/244,989, filed Oct. 3, 2008, Kito et al.
U.S. Appl. No. 12/248,577, filed Oct. 9, 2008, Katsumata et al.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A semiconductor memory device has a semiconductor substrate, first select transistors formed on the surface of said semiconductor substrate, first dummy transistors formed above said first select transistors, a plurality of memory cell transistors formed above said first dummy transistors so as to extend in a direction perpendicular to the surface of said semiconductor substrate, each of said memory cell transistor including an insulating layer having a charge-accumulating function, second dummy transistors formed above said memory cell transistors, and second select transistors formed above said second dummy transistors; wherein a first potential is provided to the gate electrodes of said first select transistors and the gate electrodes of said first dummy transistors and a second potential is provided to the gate electrodes of said second select transistors and the gate electrodes of said second dummy transistors at the time of write operation to write data to said memory cell transistors.

19 Claims, 31 Drawing Sheets

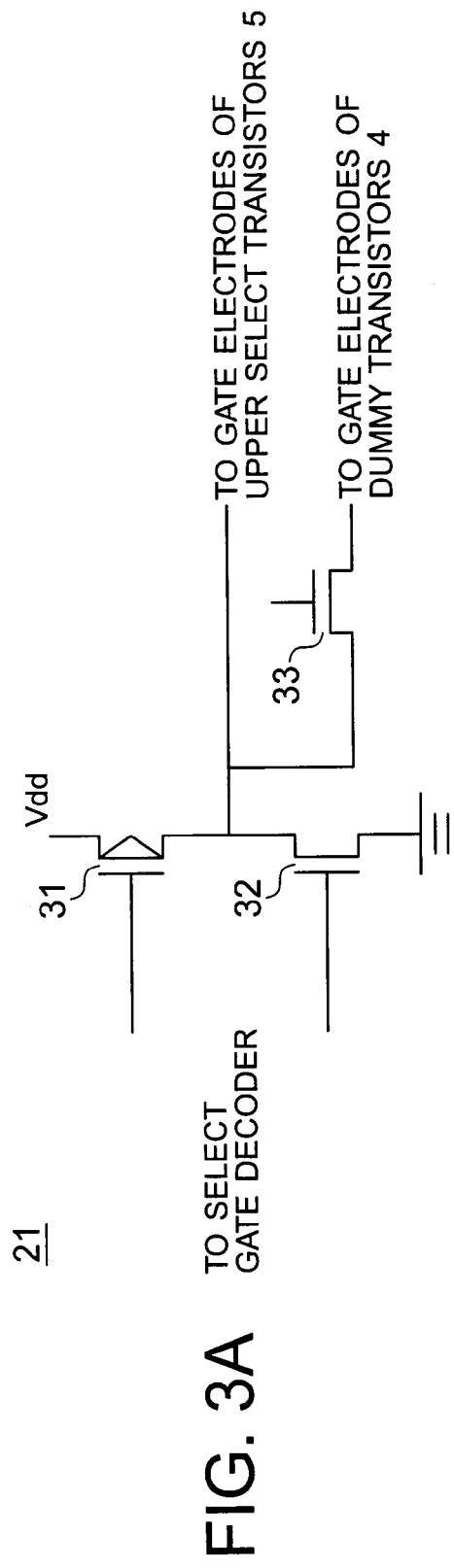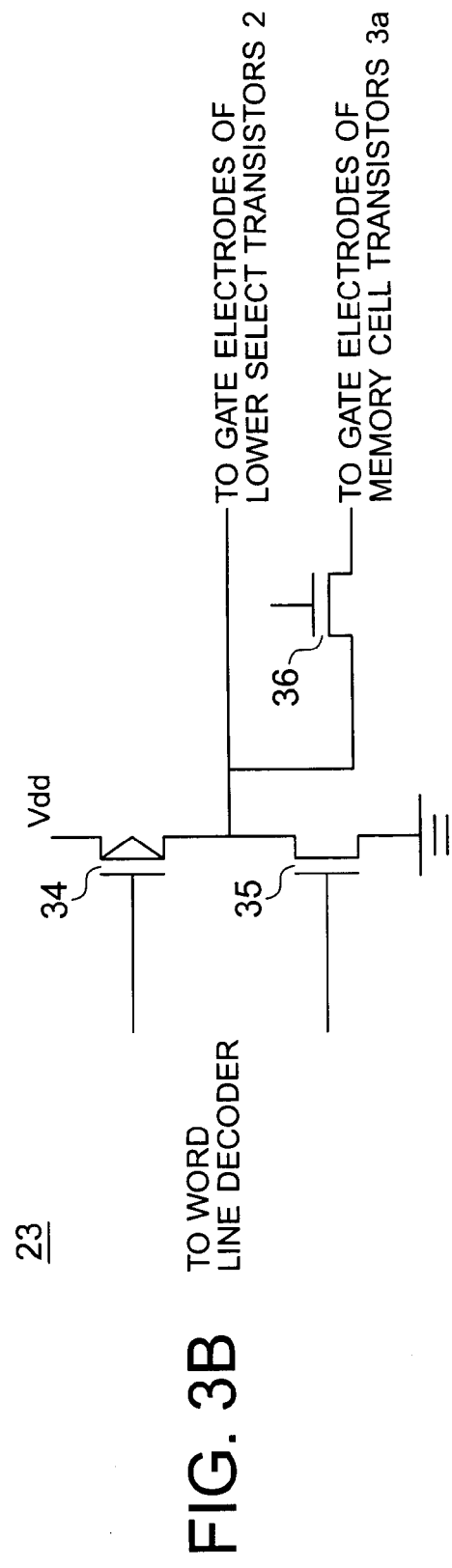
FIG. 3A
FIG. 3B

MEMORY SYSTEM, SEMICONDUCTOR MEMORY DEVICE AND METHOD OF DRIVING SAME

CROSS REFERENCE TO RELATED APPLICATIONS

This application is based upon and claims the benefit of priority from the prior Japanese Patent Application No. 2007-745, filed on Jan. 5, 2007, the entire contents of which are incorporated herein by reference.

BACKGROUND OF THE INVENTION

The present invention relates to a memory system, a semiconductor memory device and a method of driving the semiconductor memory device.

High integration is required for semiconductor memory for reasons of the enlargement of memory capacity due to a reduction in their unit price per bit.

As a technique to break through the limits of a device's high integration by miniaturization on the two-dimensional plane of a silicon substrate, there is known a method of forming the device into a three-dimensional structure by stacking transistors.

However, simply processing and stacking layers of transistors, one layer at a time, involves an increase in the number of lithography processes for patterning the structure of transistors as the number of layers increases, thereby resulting in an cost increase.

As a method wherein the number of lithography processes required for patterning is independent of the number of laminations, there is a collectively-processed lamination method. In this method, lower select transistors are first formed on a silicon substrate.

Next, polysilicon layers and silicon dioxide films are alternately stacked on top of each other over the lower select transistors. The number of polysilicon layers is determined according to the number of transistors in a memory structure wherein the transistors are stacked in a direction perpendicular to the silicon substrate.

Next, holes penetrating to the drain diffused layers of the lower select transistors are formed and charge-accumulating layers are formed on the side walls of the holes. Since the transistors of a memory region are collectively formed by creating holes, the number of lithography processes does not increase even if the number of laminations is increased. After amorphous silicon to serve as silicon bodies is deposited in the holes and word lines are processed, upper select transistors are formed in the memory region (having a polysilicon-silicon dioxide film laminated structure).

Now, the operating principles of a lamination-structured memory formed in such a manner as described above will be described. When writing data, an off level, i.e., 0 V, is applied to the gates of the lower select transistors (lower select gates), a voltage Vsg is applied to the upper select gates of selected lines, and an off level (0 V) is applied to the upper select gates of unselected lines.

When writing data 0, bit lines are set to 0 V, word lines corresponding to cells to be written with data 0 are boosted to Vprog, and all other word lines are boosted to Vpass. Vprog is assumed to be sufficiently higher than a voltage required to inject electrons into the charge-accumulating layers.

Since the upper select transistors are in an on state, the silicon bodies are maintained at 0 V, i.e., a bit line potential, and data 0 is written to the cells to be written with data 0 by the application of Vprog which is a word line level.

When writing data 1, the bit lines are set to voltage Vdd, word lines corresponding to cells to be written with data 1 are boosted to Vprog, and all other word lines are boosted to Vpass. The potential Vbody of the silicon bodies is raised by the coupling of the word lines boosted to Vpass, the upper select transistors go into an off state due to a back gate effect, and the silicon body potential Vbody is thus maintained.

By controlling Vpass, the boost rate thereof, and the value of the gate potential level Vsg of the upper select transistors, it is possible to control the value of Vbody. Control needs to be performed so that Vprog−Vbody is sufficiently smaller than a potential required to inject electrons into the charge-accumulating layers.

When erasing data, the word lines of a block to be erased are boosted to 0 V and the bit lines and source lines or the P wells thereof are boosted to the erase potential Verase. The potential Vsg of select gates is set to a potential value that satisfies Verase>Vsg. The silicon body potential Vbody is raised by a hole current generated by band-to-band tunneling due to a potential difference between the select gates and the source lines or bit lines, thereby erasing data.

The difference between the erase potential Verase and the select gate potential Vsg needs to be maintained so as to be able to generate a sufficient amount of hole current.

When reading data, the source lines are set to 0 V, the lower select gates are set to Vdd, i.e., an on level, word lines corresponding to cells to be read are set to 0 V, word lines corresponding to cells to be not read are set to Vread, the upper select gates are set to Vdd, and bit lines are set to Vbl.

If electrons are accumulated in the charge-accumulating layers, the threshold is 0 V or higher and, therefore, the bit line potential Vbl is maintained. On the other hand, if holes are accumulated in the charge-accumulating layers, the bit line potential Vbl is equalized to the potential of the source lines and is, therefore, lowered since the threshold is lower than 0 V and the cells to be read go into an on state.

As a result, it is possible to derive the state of charges accumulated in the charge-accumulating layers as a signal. Note that a voltage adequate for the cells being not read to turn on is selected for Vread.

When writing data 1, the source voltage of the lower select transistors is set to 0 V, the drain voltage thereof is set to Vbody, and the gate voltage thereof is set to 0 V. Holes generated by band-to-band tunneling at drain ends are accumulated on gate surfaces due to gate electric fields and, therefore, the gate electric fields are shielded. As a result, there is the possibility that it is no longer possible to maintain depleted regions in the central parts of the silicon bodies, thereby causing a leak current to flow.

Thus, the memory device has the problem that if the leak current cannot be kept sufficiently low, the silicon body potential Vbody drops and there occurs miswriting wherein data 0 is written to cells to which data 1 should be written.

On the other hand, in order to boost the silicon bodies at the time of erase operation by boosting the bit lines and source lines (or P wells), there is the need for a hole current to be generated by band-to-band tunneling at an overlapping portion between each select gate and each diffused layer on the silicon body side.

If the hole current is not sufficiently large, it is not possible to boost the silicon bodies by the bit line and source line potentials.

As described above, in the case of the lamination-structure memory formed using a collectively-processed lamination method, it is necessary to suppress band-to-band tunneling at the time of write operation and accelerate the tunneling at the time of erase operation.

SUMMARY OF THE INVENTION

According to one aspect of the present invention, there is provided a semiconductor memory device comprising:
a semiconductor substrate;
first select transistors formed on the surface of said semiconductor substrate;
first dummy transistors formed above said first select transistors;
a plurality of memory cell transistors formed above said first dummy transistors so as to extend in a direction perpendicular to the surface of said semiconductor substrate, each of said memory cell transistor including an insulating layer having a charge-accumulating function;
second dummy transistors formed above said memory cell transistors; and
second select transistors formed above said second dummy transistors; wherein a first potential is provided to the gate electrodes of said first select transistors and the gate electrodes of said first dummy transistors and a second potential is provided to the gate electrodes of said second select transistors and the gate electrodes of said second dummy transistors at the time of write operation to write data to said memory cell transistors.

According to one aspect of the present invention, there is provided a method of driving a semiconductor memory device comprising a semiconductor substrate; first select transistors formed on the surface of said semiconductor substrate; first dummy transistors formed above said first select transistors; a plurality of memory cell transistors formed above said first dummy transistors so as to extend in a direction perpendicular to the surface of said semiconductor substrate, each of said memory cell transistor including an insulating layer having a charge-accumulating function; second dummy transistors formed above said memory cell transistors; and second select transistors formed above said second dummy transistors; wherein a first potential is provided to the gate electrodes of said first select transistors and the gate electrodes of said first dummy transistors and a second potential is provided to the gate electrodes of said second select transistors and the gate electrodes of said second dummy transistors at the time of data write operation.

According to one aspect of the present invention, there is provided a memory system comprising:
a storage portion including a semiconductor substrate; first select transistors formed on the surface of said semiconductor substrate; first dummy transistors formed above said first select transistors; a plurality of memory cell transistors formed above said first dummy transistors so as to extend in a direction perpendicular to the surface of said semiconductor substrate, each of said memory cell transistor including an insulating layer having a charge-accumulating function; second dummy transistors formed above said memory cell transistors; and second select transistors formed above said second dummy transistors;
word line drivers for applying a voltage to the gate electrodes of said plurality of memory cell transistors;
drivers connected to the gate electrodes of said first select transistors and the gate electrodes of said first dummy transistors to provide the same potential to the gate electrodes of said first select transistors and the gate electrodes of said first dummy transistors at the time of write operation to write data to said memory cell transistors; and
a select gate driver connected to the gate electrodes of said second select transistors and the gate electrodes of said second dummy transistors to provide the same potential to the gate electrodes of said second select transistors and the gate electrodes of said second dummy transistors at the time of write operation to write data to said memory cell transistors.

BRIEF DESCRIPTION OF THE DRAWINGS

FIG. 3A is a schematic view illustrating the circuitry of a driver in the drive circuit;

FIG. 3B is a schematic view illustrating the circuitry of a driver in the drive circuit;

DESCRIPTION OF THE EMBODIMENTS

Hereinafter, embodiments of the present invention will be described with reference to the accompanying drawings.

Figure 1:
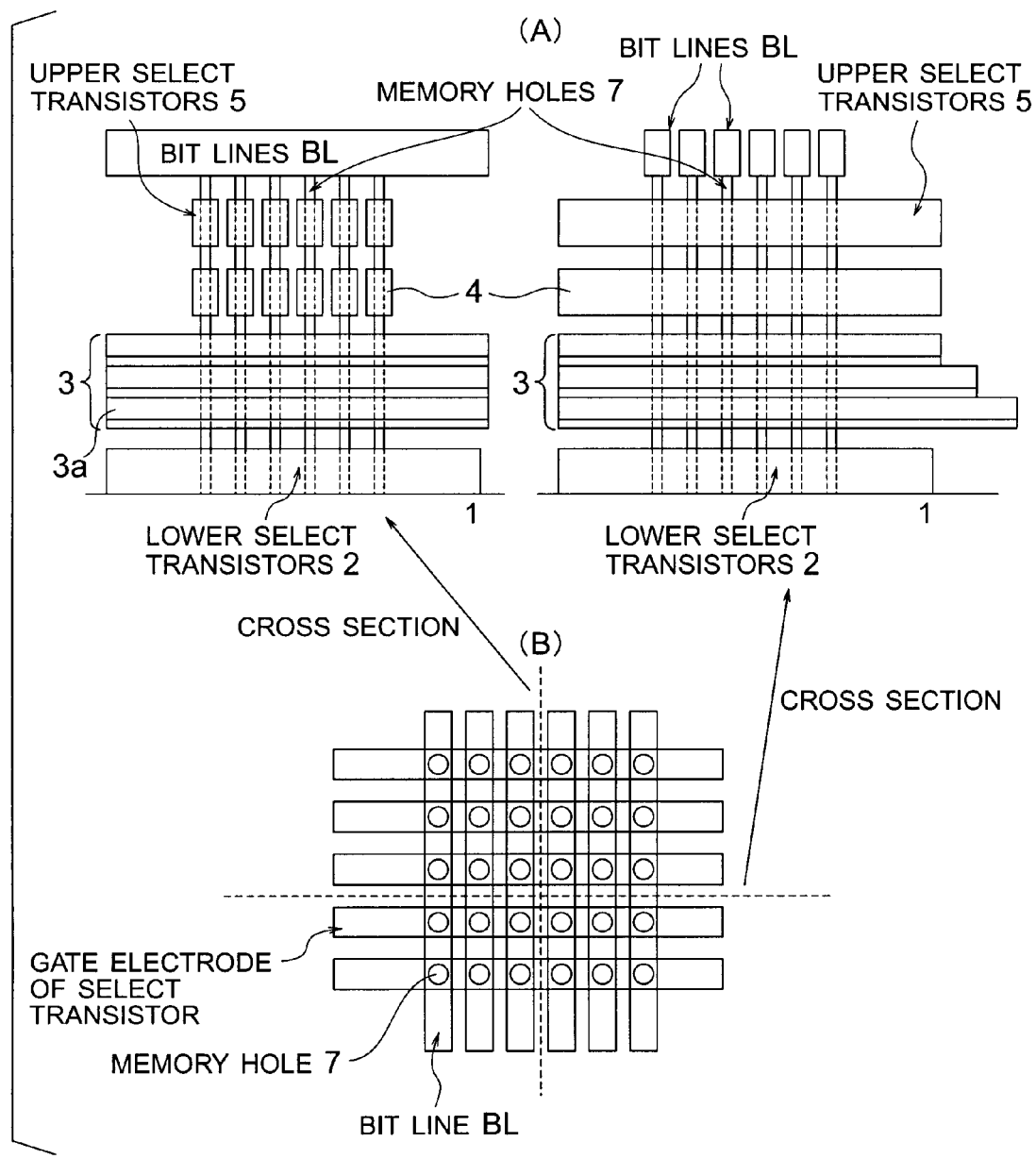
FIG. 1 is a schematic view illustrating an approximate structure of a semiconductor memory device in accordance with an embodiment of the present invention.

FIG. 1 is a schematic view illustrating an approximate structure of a semiconductor memory device in accordance with an embodiment of the present invention, wherein FIG. 1(A) shows a vertical cross section of the semiconductor memory device and FIG. 1(B) shows the upper surface thereof.

The semiconductor memory device is provided with a substrate 1, lower select transistors 2 formed on the substrate 1, memory arrays 3 extending in a direction perpendicular to the plane of the substrate 1 above the lower select transistors 2 and having a plurality of memory cell transistors including charge-accumulating layers capable of retaining data, dummy transistors 4 formed above the memory arrays 3, and upper select transistors 5 formed above the dummy transistors 4.

Bit lines BL are connected to the upper select transistors 5. In addition, the memory cell transistors are respectively connected to word lines WL (not shown in the figure) and the source electrodes of the lower select transistors 2 are connected to source lines (not shown in the figure). Memory holes (bodies) 7 are formed in arrays in the vertical direction from the upper select transistors 5 to the lower select transistors 2.

Figure 2:
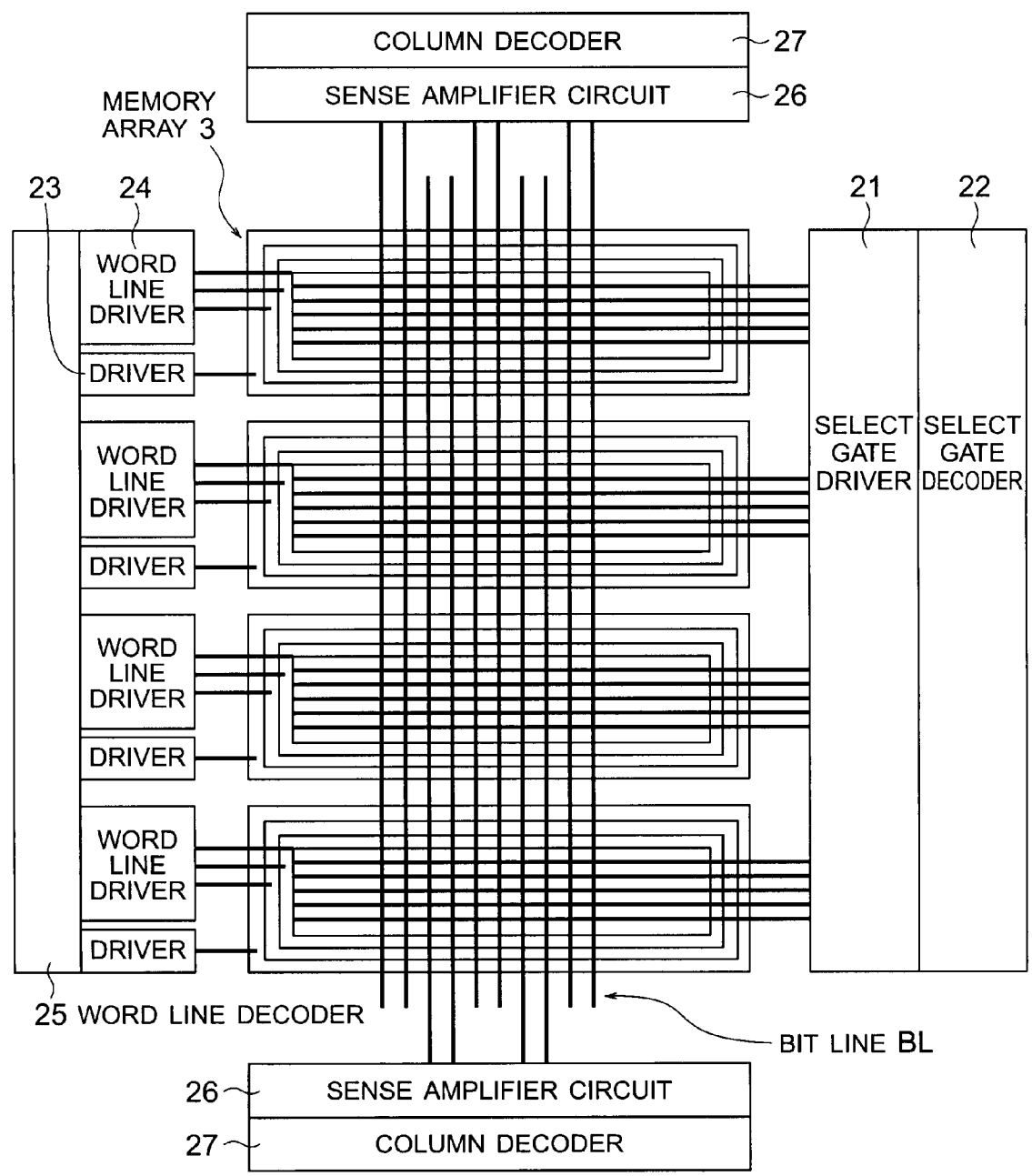
FIG. 2 is a schematic view illustrating the circuitry of the drive circuit of the semiconductor memory device in accordance with the foregoing embodiment of the present invention.

Now a method of driving the select transistors 2 and 5, the dummy transistors 4, the bit lines BL and the word lines WL will be described using FIG. 2. The gate electrodes of the upper select transistors 5 and the dummy transistors 4 are connected to a select gate driver 21. The select gate driver 21 is connected to a select gate decoder 22.

The gate electrodes of the lower select transistors 2 are connected to drivers 23. The word lines WL are connected to word line drivers 24. Note however that word lines WL corresponding to memory cell transistors 3a adjacent to the lower select transistors 2, i.e., memory cell transistors 3a in the undermost layer of each memory array 3 are connected to the drivers 23. The drivers 23 and the word line drivers 24 are connected to a word line decoder 25.

The bit lines BL are connected to a sense amplifier circuit 26 and the sense amplifier circuit 26 is connected to a column decoder 27.

The column decoder 27 selects bit lines BL according to given column addresses and provides a desired voltage to the bit lines BL. The word line decoder 25 selects desired word lines WL according to given address signals.

The word line drivers 24 provide a desired voltage to the word lines WL selected by the word line decoder 25. In addition, the drivers 23 provide a desired voltage to the lower select transistors 2 and the memory cell transistors 3a in the undermost layer according to the selection of word lines by the word line decoder 25.

The select gate decoder 22 selects the upper select transistors 5 and the dummy transistors 4 according to given address signals and the select gate driver 21 provides a desired voltage to these transistors.

FIG. 3A shows an approximate configuration of the select gate driver 21. The select gate driver 21 has a PMOS transistor 31 and an NMOS transistor 32 series-connected to each other, and an NMOS transistor 33.

One end of the source-drain path of the NMOS transistor 33 is connected to the connection point of the PMOS transistor 31 and the NMOS transistor 32, to which the gate electrodes of the upper select transistors 5 are also connected.

The other end of the source-drain path of the NMOS transistor 33 is connected to the gate electrodes of the dummy transistors 4.

The gate electrodes of the PMOS transistor 31 and the NMOS transistors 32 and 33 are connected to the select gate decoder 22 and are on/off-controlled. The NMOS transistor 33 is turned on at the time of data write operation and turned off at the time of data erase operation.

FIG. 3B shows an approximate configuration of the drivers 23. Each driver 23 has a PMOS transistor 34 and NMOS transistors 35 and 36, and is configured in the same manner as the select gate driver 21. One end of the NMOS transistor 36 is connected to the gate electrode of each lower select transistor 2 and the other end thereof is connected to the gate electrode of each memory cell transistor 3a in the undermost layer of each memory array 3.

The gate electrodes of the PMOS transistor 34 and the NMOS transistors 35 and 36 are connected to the word line decoder 25 and are on/off-controlled. The NMOS transistor 36 is turned on at the time of data write operation and turned off at the time of data erase operation.

Now, the operation of such a semiconductor memory device as discussed above will be described. Hereinafter, the gate electrodes of the lower select transistors 2 are referred to as lower select gates, the gate electrodes of the upper select transistors 5 are referred to as upper select gates, the gate electrodes of the dummy transistors 4 are referred to as upper dummy gate electrodes, and the gate electrodes of the memory cell transistors 3a in the undermost layer of each memory array 3 are referred to as lower dummy gate electrodes.

First, write operation will be described. At the time of write operation, both the NMOS transistor 33 of the select gate driver 21 and the NMOS transistor 36 of each driver 23 are turned on and both the lower select gates and the lower dummy gate electrodes are set to 0 V (off level).

In addition, an on-level potential Vsg is applied to both the upper select gates and the upper dummy gate electrodes of selected lines and 0 V (off level) is applied to the upper select gates and the upper dummy gate electrodes of unselected lines. Using the column decoder 27, the bit lines BL of the selected lines to be written with data 0 are set to 0 V and the bit lines BL thereof to be written with data 1 are set to a potential Vdd.

Using the word line decoder 25 and the word line drivers 24, word lines WL corresponding to memory cell transistors to be written with data are boosted to a potential Vprog and all other word lines WL are boosted to a potential Vpass (Vpass<Vprog). Assume here that the potential Vprog is sufficiently higher than a potential necessary to inject electrons into the charge-accumulating layers of memory cell transistors.

The potential Vbody of the bodies (wells) of each memory array 3 to be written with data 1 is raised by each word line WL boosted to the potential Vpass. Due to a back gate effect resulting from the raising of the body potential Vbody, the upper select transistors 5 go into an off state and, therefore, the body potential is maintained.

The body potential Vbody can be controlled by adjusting the potential Vpass, the boost rate thereof, and the potential Vsg of the upper select gates, so that the Vprog–Vbody is sufficiently lower than a voltage necessary to inject electrons into the charge-accumulating layers of memory cell transistors.

Since holes generated by band-to-band tunneling are trapped within the lower dummy gate electrodes, it is possible to sufficiently reduce leak currents (off currents) at the lower select transistors 2. Consequently, the body potential Vbody is prevented from dropping and thus miswriting (data 0 is written to memory transistors whereto data 1 should be written) can be prevented.

Likewise, the body potential Vbody is prevented from dropping by reducing leak currents at the upper select transistors 5 using the upper dummy gate electrodes and thus miswriting can be prevented.

The body potential Vbody of memory arrays 3 to be written with data 0 is maintained at 0 V as the result that the upper select transistors 5 and the dummy transistors 4 maintain themselves in an on state. Consequently, data 0 is written by the application of the potential Vprog of each word line WL.

Note that since both the upper select transistors 5 and the lower select transistors 2 are in an off state in unselected lines, the bodies (wells) of these transistors are in a state of being cut off from the bit lines BL and source lines and, therefore, the memory arrays 3 maintain their original data.

Next, readout operation will be described. Both the NMOS transistor 33 of the select gate driver 21 and the NMOS transistor 36 of each driver 23 are turned on. 0 V is applied to the source lines and a potential Vdd is applied to the lower select gates and the lower dummy gate electrodes.

Word lines WL corresponding to memory cell transistors to be read are maintained at 0 V and word lines WL corresponding to memory cell transistors to be not read are boosted to a potential Vread. The potential Vread does not depend on the state of retaining charge by the charge-accumulating layers of memory cell transistors and is high enough to turn on the transistors.

The potential Vdd is applied to the upper select gates and the upper dummy gate electrodes. The potential Vbl is applied to the bit lines BL to charge the sense amplifier circuit 26 whereto the bit lines BL are connected, so as to activate the sense amplifier circuit 26.

Since the threshold is set to 0 V or lower if electrons are accumulated in the memory cell transistors to be read, the memory cell transistors turn on and the potential Vbl applied to the bit lines BL is connected to the source lines and is thus lowered.

Consequently, it is possible to derive the state of charges accumulated in the charge-accumulating layers of the memory cell transistors to be read as a signal according to whether or not the potential Vbl is lowered.

Next, erase operation will be described. The word lines WL of a block to be erased are set to 0 V and the bit lines BL and source lines thereof are boosted to the erase potential Verase. A potential Vsg lower than the Verase is applied to the upper select gates and the lower select gates.

In addition, the NMOS transistor 33 of the select gate driver 21 and the NMOS transistor 36 of each driver 23 are turned off and the upper dummy gate electrodes and the lower dummy gate electrodes are set to a floating potential. The body potential Vbody is raised and data is erased using a hole current generated at this point by band-to-band tunneling due to a potential difference between the upper select gates and the bit lines BL and a potential difference between the lower select gates and the source lines.

A hole current is generated in an efficient manner by the upper dummy gate electrodes and the lower dummy gate electrodes. The difference between the erase potential Verase and the potential Vsg is maintained at such a value as to generate a sufficient amount of hole current.

As described above, using the semiconductor memory device in accordance with the present embodiment, it is possible to efficiently raise the body potential by a hole current at the time of erase operation and suppress the occurrence of leak currents due to band-to-band tunneling at the lower select transistors at the time of write operation to write data 1, thereby preventing miswriting.

Furthermore, it is also acceptable to make the impurity concentration of the sources (diffused layers on the source line side) of the lower select transistors 2 and the impurity concentration of the drains (diffused layers on the bit line side) of the upper select transistors 5 higher than the impurity concentration of the diffused layers of the dummy transistors 4.

Consequently, it is possible to further suppress hole accumulation in the gate electrodes of the select transistors 2 and 5 at the time of write operation to write data 1, thereby preventing a degradation in cut-off characteristics.

In addition, using a band-to-band tunneling current generated between the upper and lower select gates and the high-concentration diffused layers, it is possible to efficiently generate holes necessary to erase data.

Next, a method of manufacturing the semiconductor memory device in accordance with the present embodiment will be described using the accompanying drawings.

Figure 4:
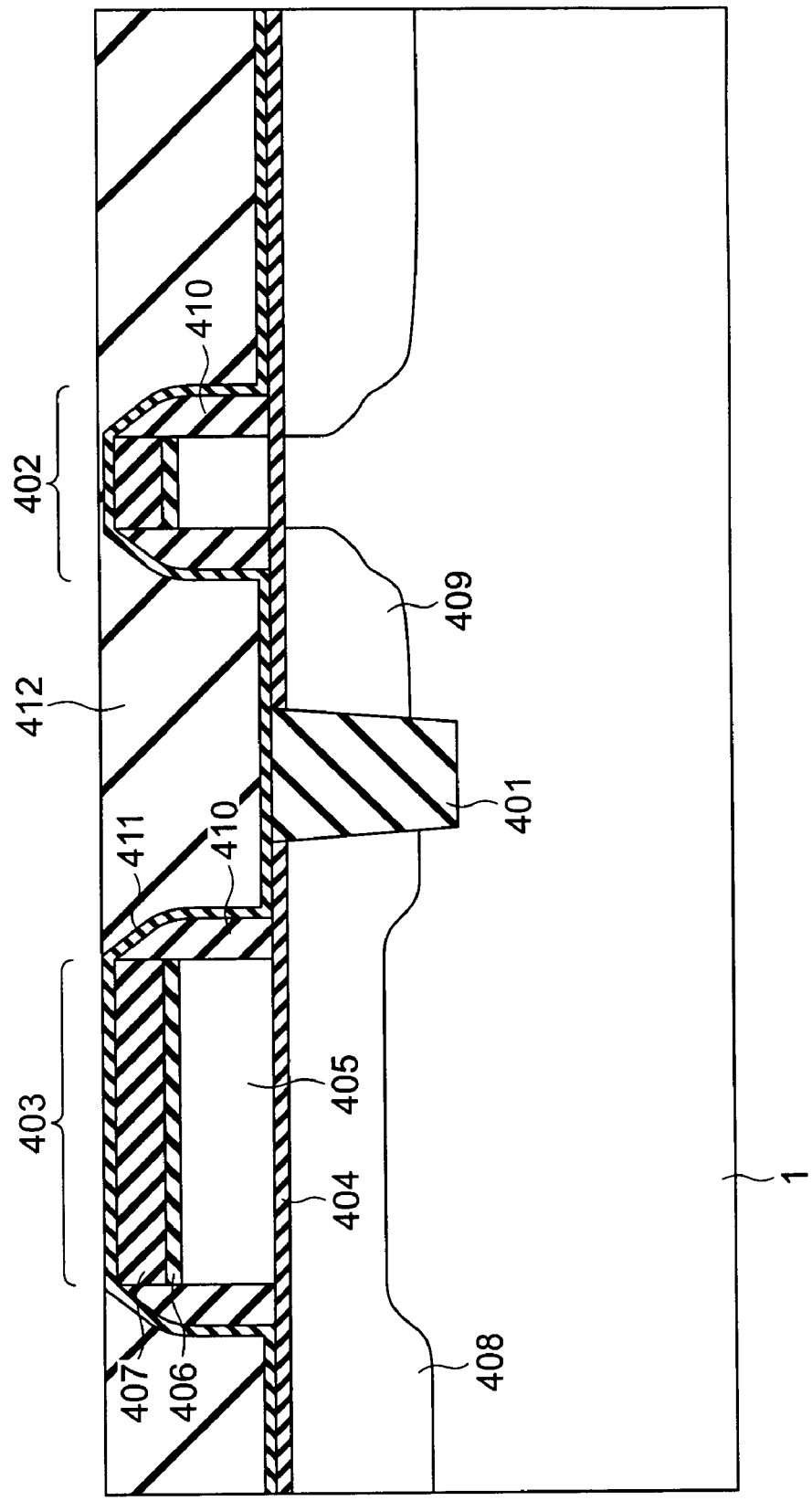
FIG. 4 is a schematic view illustrating a vertical cross-section in one process showing a method of manufacturing the semiconductor memory device in accordance with the foregoing embodiment of the present invention.

As shown in FIG. 4, after forming a source line diffused layer 408 and an element-isolating region (shallow trench isolation: STI) 401 on a silicon substrate 1, planar-structured transistors (peripheral transistor 402 and transistor 403) are formed on the silicon substrate 1.

The transistor 403 has a laminated structure composed of a silicon dioxide film 404, a polysilicon film 405, a TEOS film 406 and a cap silicon nitride film 407 and will later serve as the gate electrode of each lower select transistor. The film thicknesses of the silicon dioxide film 404, polysilicon film 405, TEOS film 406 and cap silicon nitride film 407 are, for example, 50 nm, 200 nm, 20 nm, and 100 nm, respectively.

Then, after forming a diffused layer 409, a spacer TEOS film 410 and a barrier silicon nitride film 411, an interlayer insulating film 412 is deposited and planarized.

Figure 5:
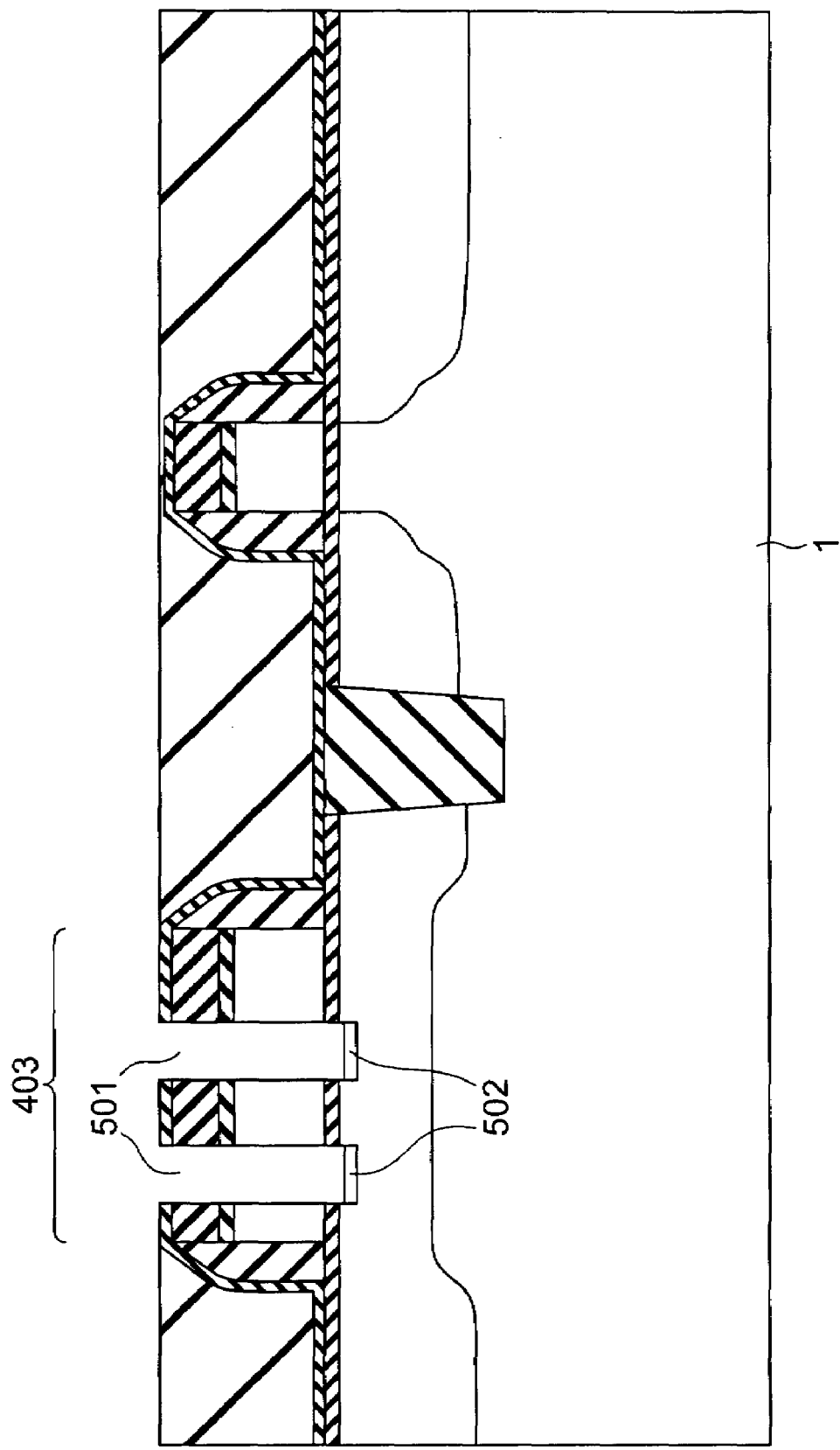
FIG. 5 is a schematic view illustrating a vertical cross-section in one process showing a method of manufacturing the semiconductor memory device in accordance with the foregoing embodiment of the present invention.

As shown in FIG. 5, using a hole pattern formed on the transistor 403 with a resist mask, holes 501 for exposing the silicon substrate 1 are created in a matrix shape by means of reactive ion etching (RIE).

Then, an n-type phosphorous impurity, for example, is implanted at an acceleration voltage of 10 keV and at a dosage of 3e15 ions/cm$^2$ to form a diffused layer 502 (diffused layer on the source side of the lower select transistors) via the holes 501.

Figure 6:
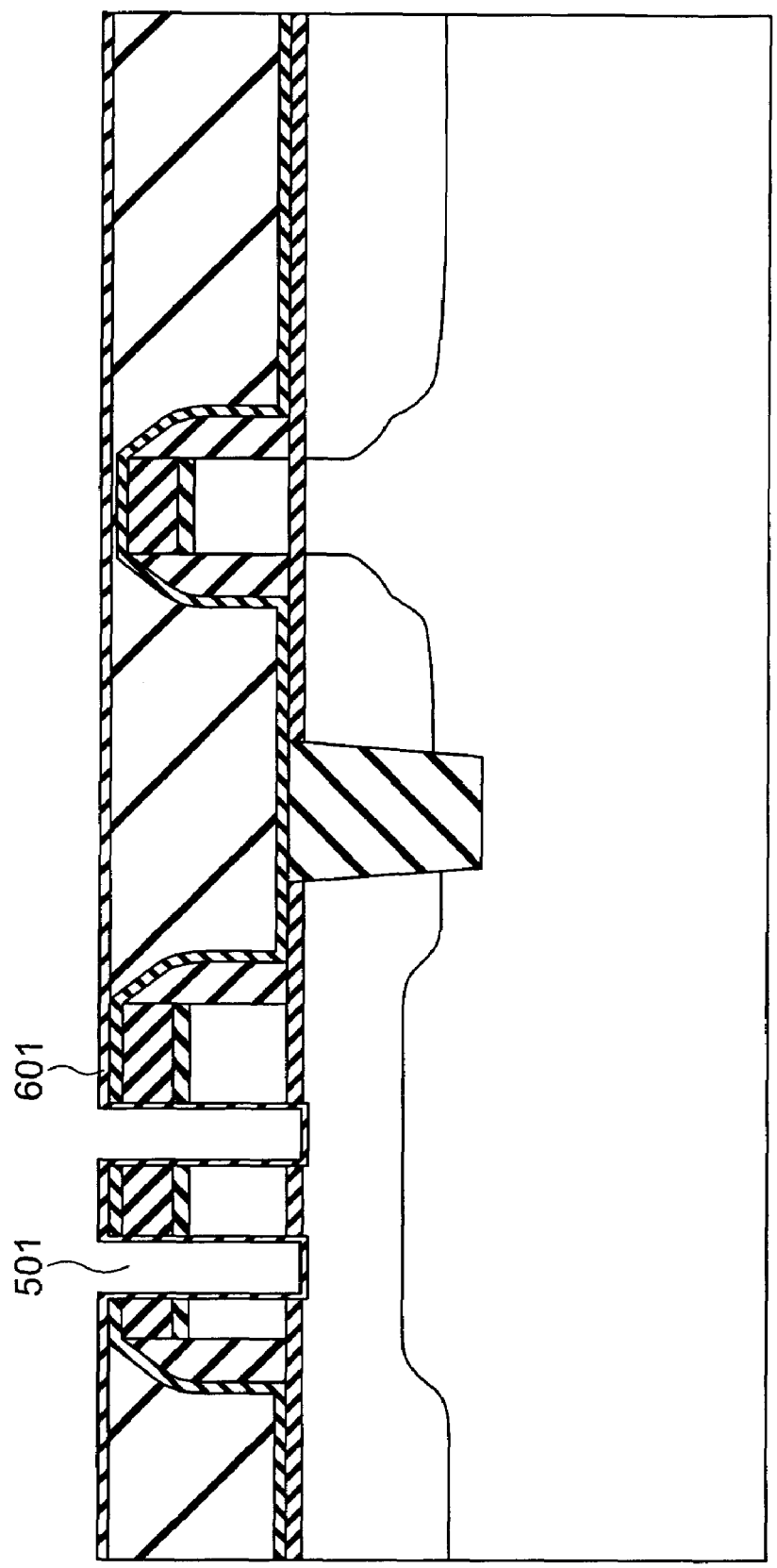
FIG. 6 is a schematic view illustrating a vertical cross-section in one process showing a method of manufacturing the semiconductor memory device in accordance with the foregoing embodiment of the present invention.

As shown in FIG. 6, a 10 nm-thick silicon dioxide film 601 is deposited on the inner walls of the holes 501 using a low-pressure chemical vapor deposition (LPCVD) process. The silicon dioxide film 601 serves as the gate-insulating films of the lower select transistors.

Figure 7:
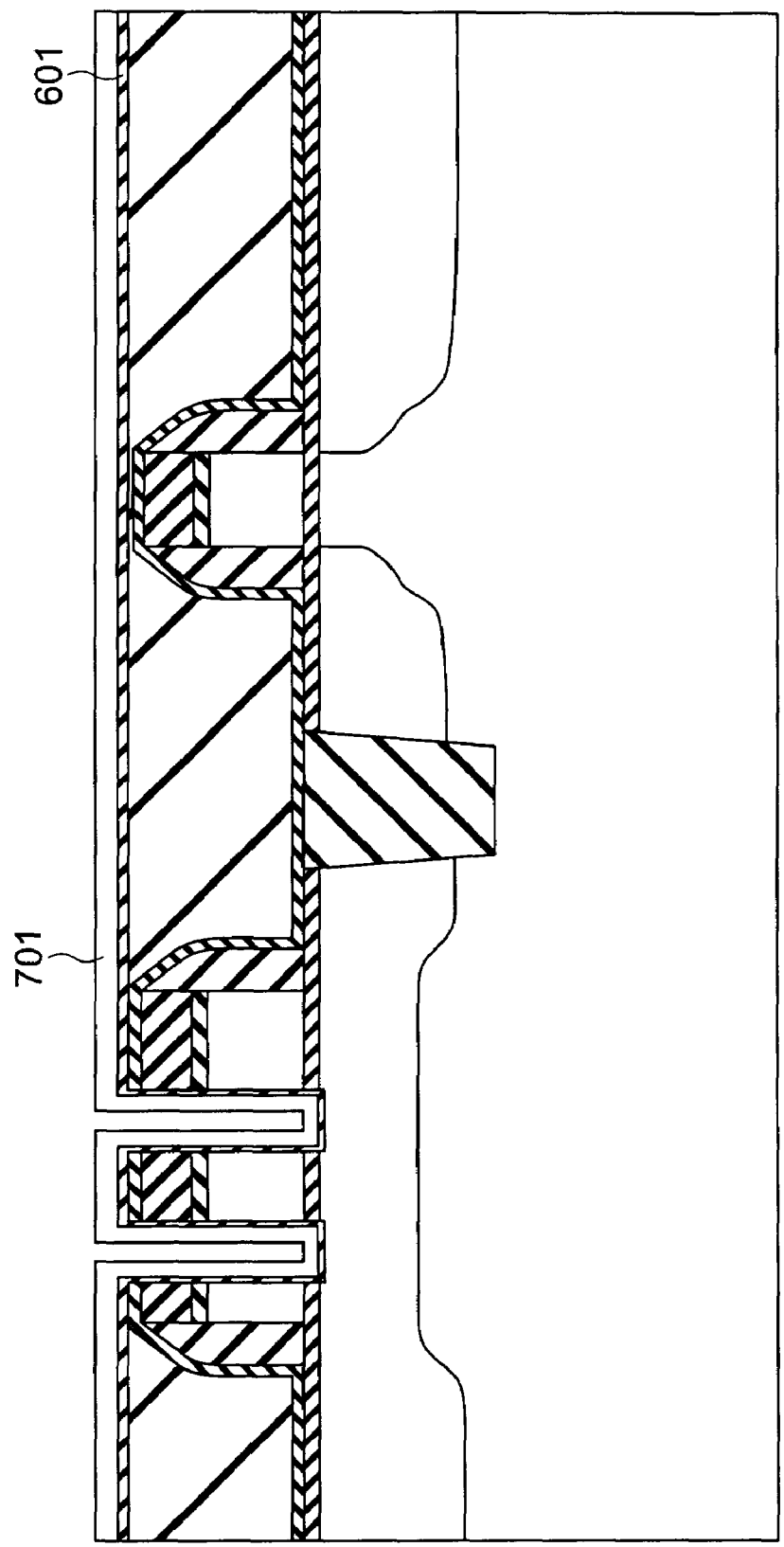
FIG. 7 is a schematic view illustrating a vertical cross-section in one process showing a method of manufacturing the semiconductor memory device in accordance with the foregoing embodiment of the present invention.

As shown in FIG. 7, a 15 nm-thick amorphous silicon film 701 is deposited on the silicon dioxide film 601.

Figure 8:
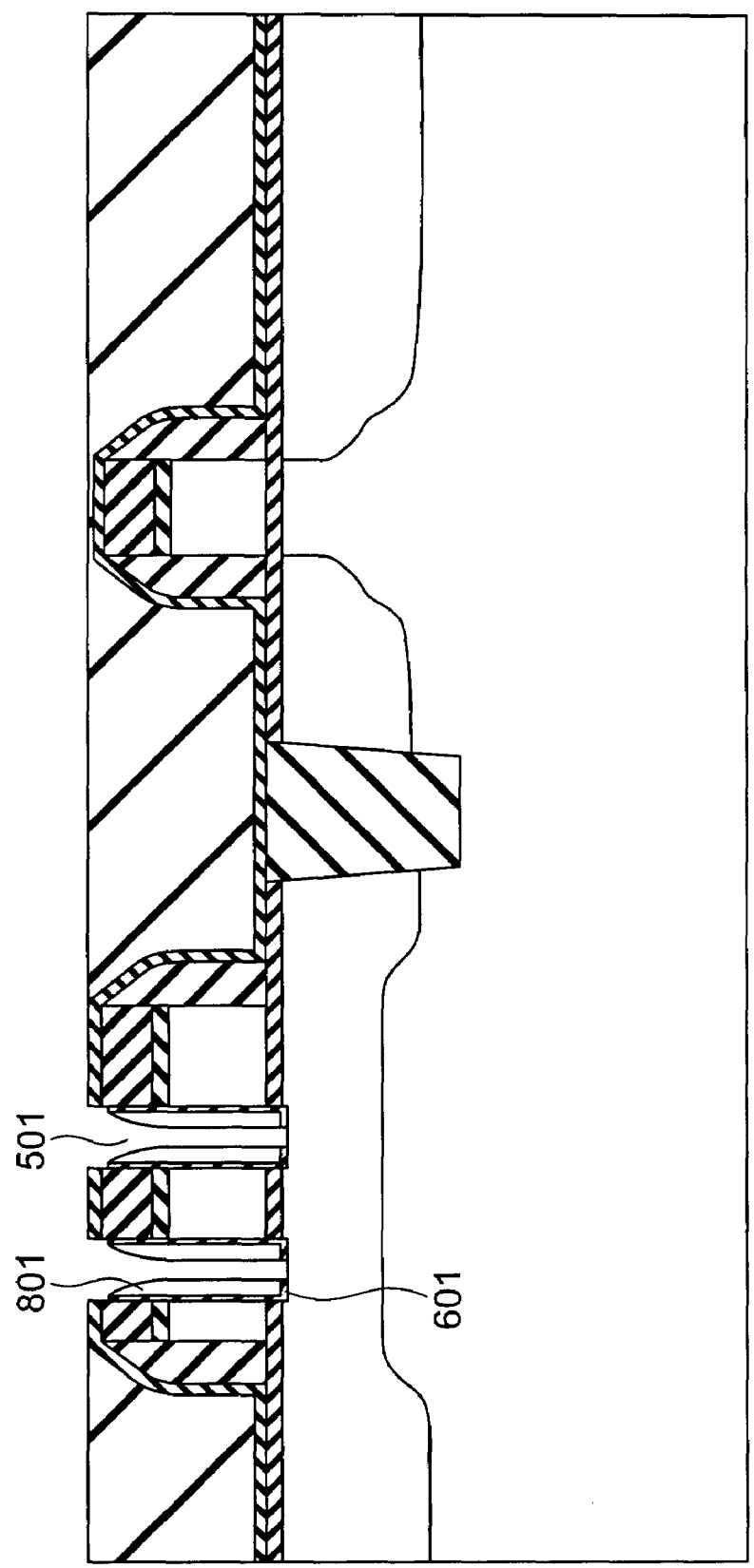
FIG. 8 is a schematic view illustrating a vertical cross-section in one process showing a method of manufacturing the semiconductor memory device in accordance with the foregoing embodiment of the present invention.

As shown in FIG. 8, the amorphous silicon film 701 in portions other than the side walls of the holes 501 is removed by RIE, to form spacers 801 on the side walls of the holes 501. Then, using the spacers 801 as a protective material for the silicon dioxide film 601 deposited on the side walls of the holes 501, the silicon dioxide film 601 in portions other than the side walls of the holes 501 is removed by RIE.

Figure 9:
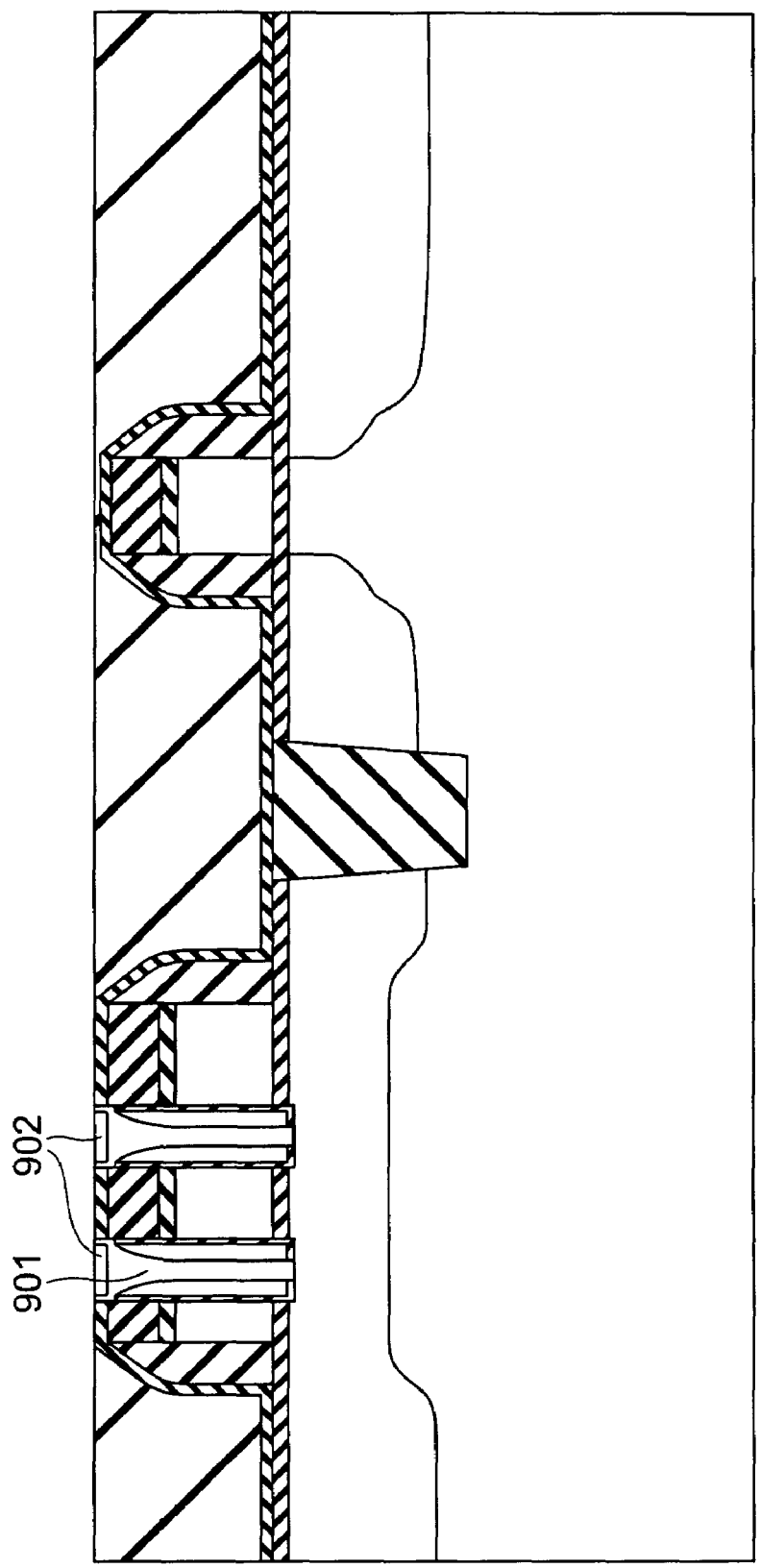
FIG. 9 is a schematic view illustrating a vertical cross-section in one process showing a method of manufacturing the semiconductor memory device in accordance with the foregoing embodiment of the present invention.

As shown in FIG. 9, amorphous silicon 901 to serve as bodies is deposited and planarized. Then, phosphorous is implanted on the condition of the acceleration voltages being 220 keV, 250 keV and 280 keV and the dosage being 5e11 cm$^{-2}$, in order to carry out the doping of the channel portions of the lower select transistors. The reason for changing the conditions is to carry out doping evenly in the vertical direction.

Then, arsenic is implanted on the condition of the acceleration voltage being 40 keV and the dosage being 3×10$^{15}$ cm$^{-2}$, in order to form diffused layers 902 (diffused layers on the drain side of the lower select transistors). The diffused layers 902 are activated using a 960° C./10 sec RTA process.

Figure 10:
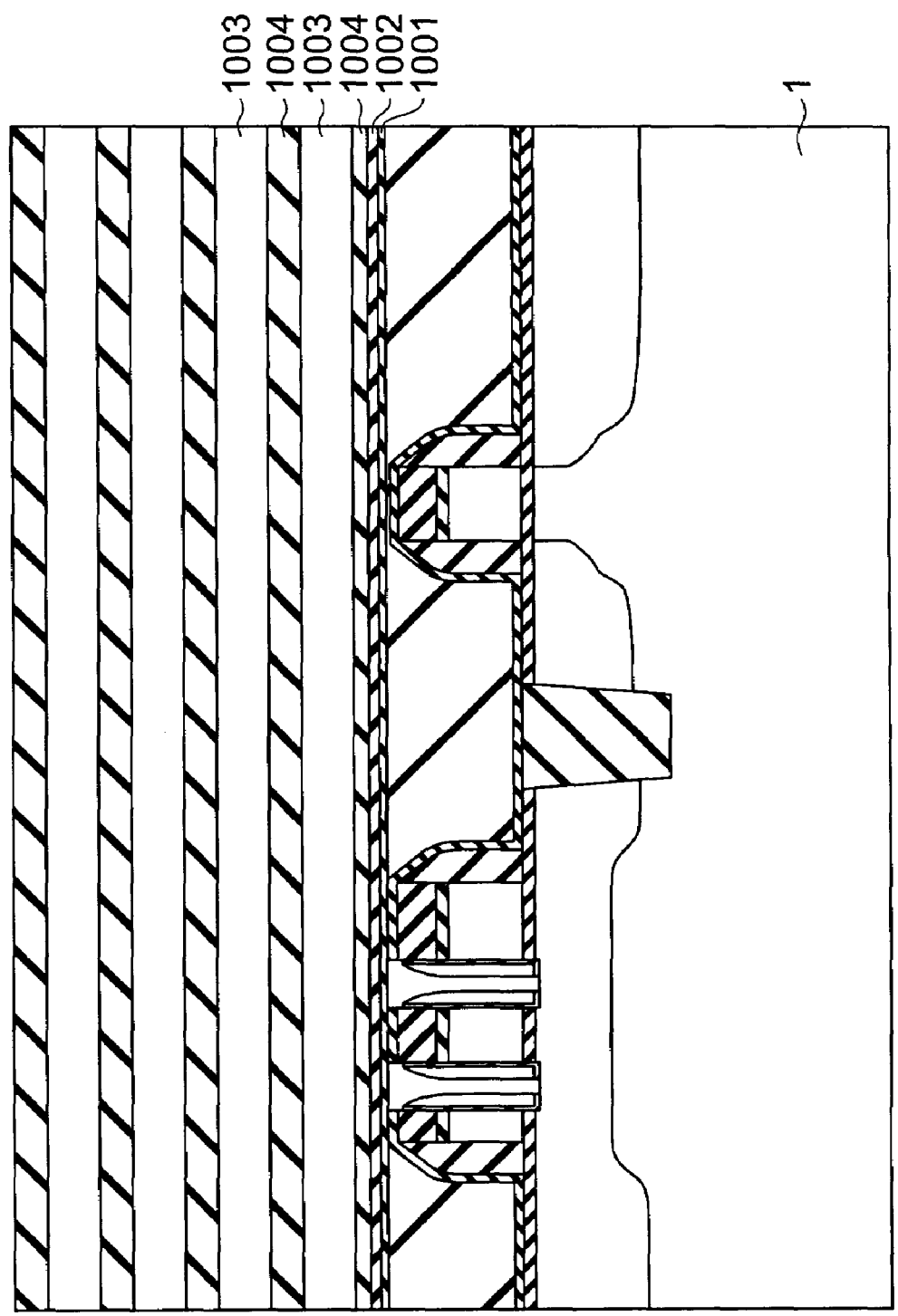
FIG. 10 is a schematic view illustrating a vertical cross-section in one process showing a method of manufacturing the semiconductor memory device in accordance with the foregoing embodiment of the present invention.

As shown in FIG. 10, after depositing a stopper TEOS film 1001 and a stopper silicon nitride film 1002, polysilicon films 1003 and silicon dioxide films 1004 are alternately stacked on top of each other. These polysilicon films 1003 serve as the gate electrodes of memory arrays.

The number of stacked polysilicon films 1003 is determined according to the number of memory transistors in a memory structure wherein the transistors are stacked in a direction perpendicular to the silicon substrate 1. Note that the gate electrodes in the undermost layer of each memory array serve as lower dummy gate electrodes.

Figure 11:
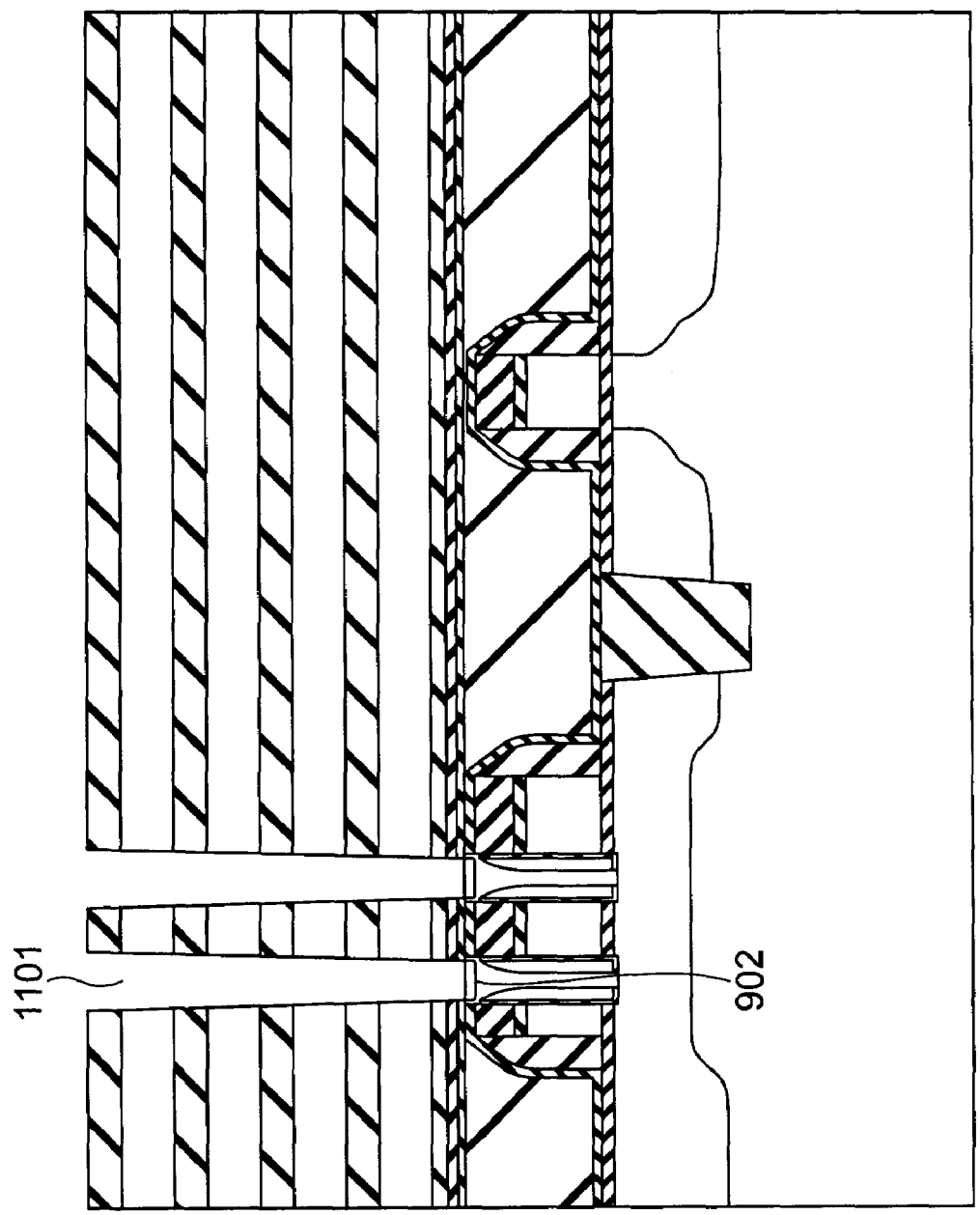
FIG. 11 is a schematic view illustrating a vertical cross-section in one process showing a method of manufacturing the semiconductor memory device in accordance with the foregoing embodiment of the present invention.

As shown in FIG. 11, using an RIE process wherein the resist structure of a hole pattern formed by lithography is used as a mask, memory holes 1101 penetrating to the diffused layers 902 are created in a matrix shape.

Figure 12:
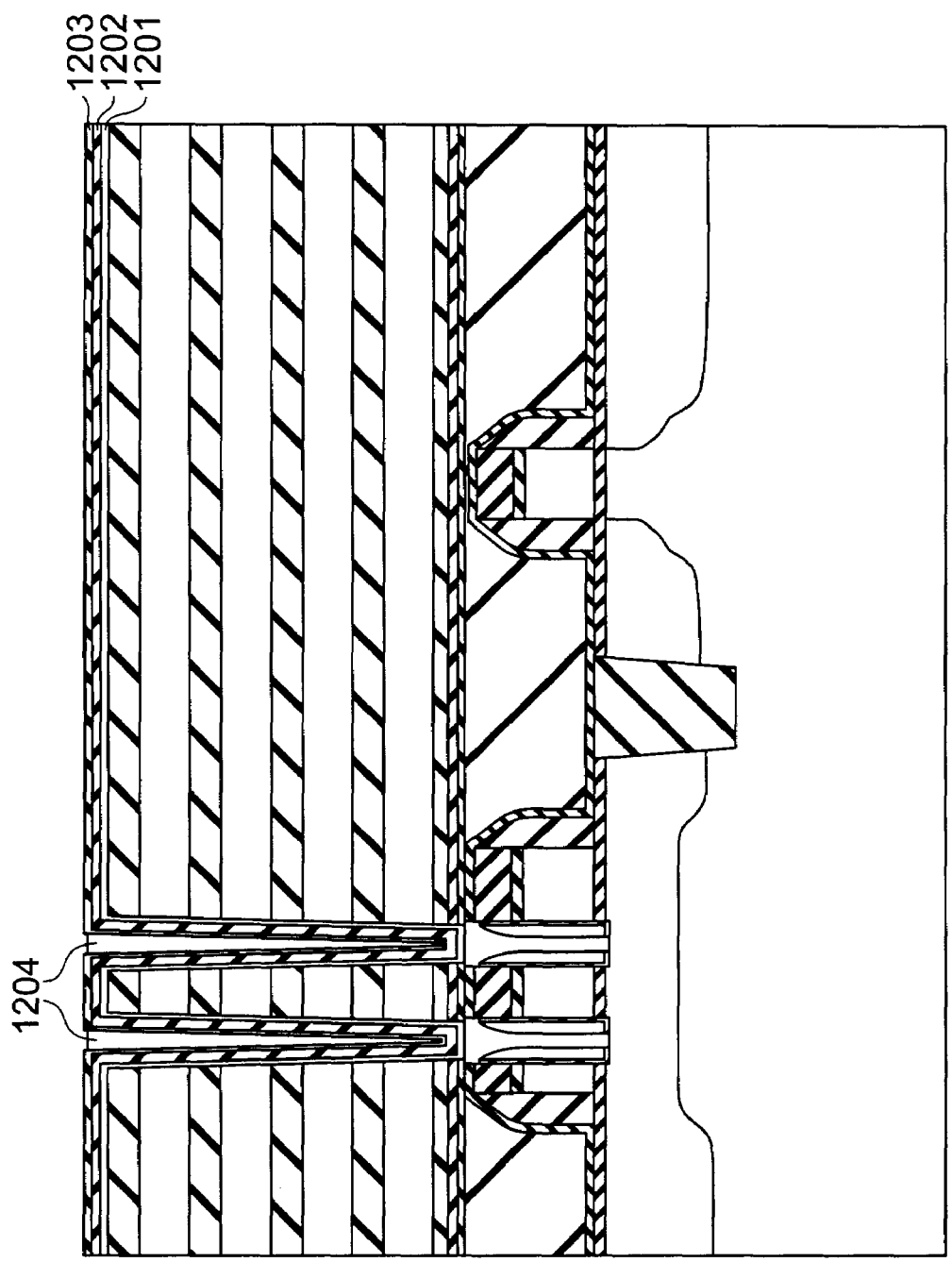
FIG. 12 is a schematic view illustrating a vertical cross-section in one process showing a method of manufacturing the semiconductor memory device in accordance with the foregoing embodiment of the present invention.

As shown in FIG. 12, a 10 nm-thick alumina film 1201, a 5 nm-thick silicon nitride film 1202 to serve as a charge-accumulating layer, and a 4 nm-thick silicon dioxide film 1203 are stacked on the inner walls of the memory holes 1101, and then a 10 nm-thick polysilicon film 1204 is deposited to form a polysilicon film-alumina film-silicon nitride film-silicon dioxide film-polysilicon film structure (SANOS structure).

Figure 13:
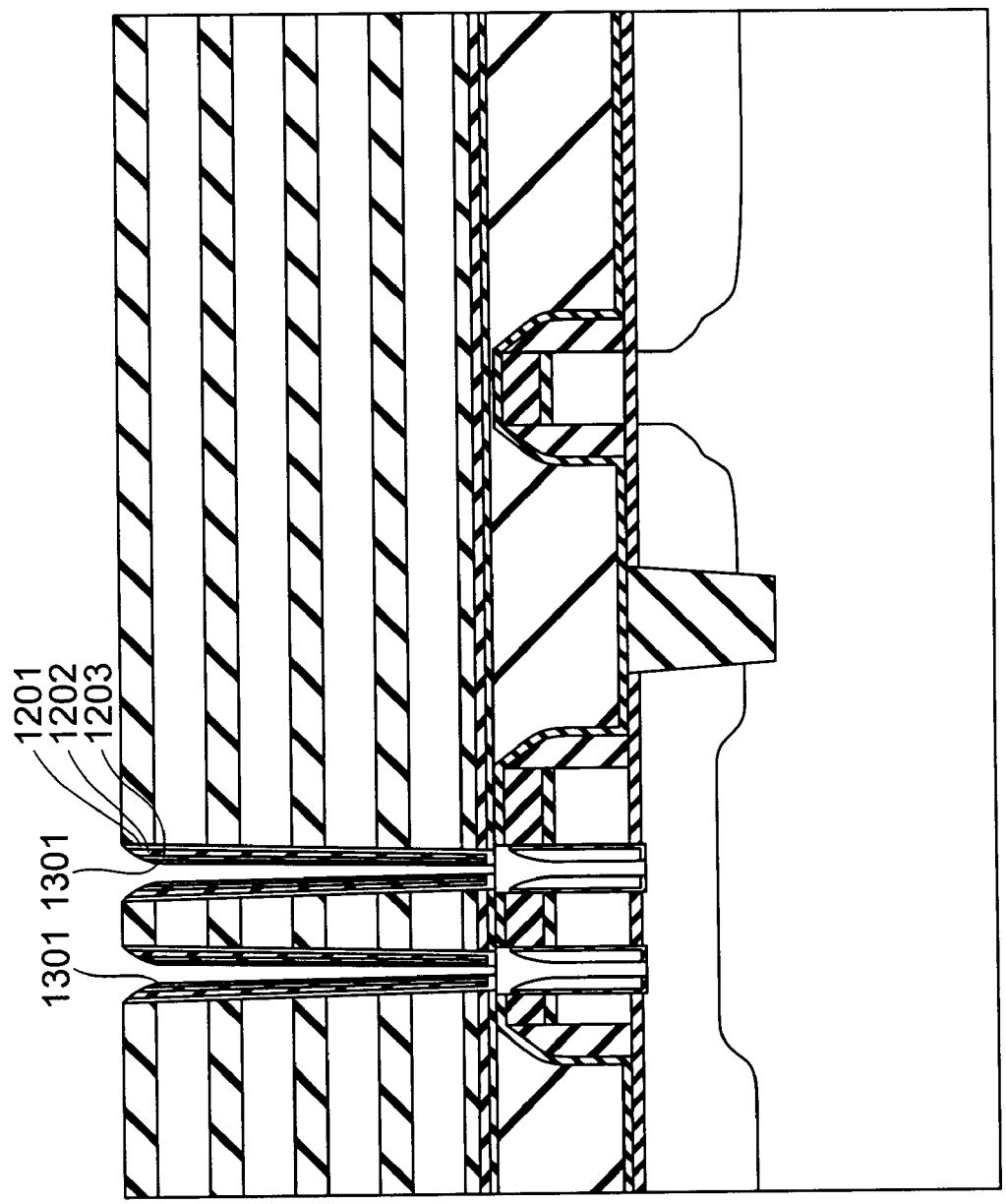
FIG. 13 is a schematic view illustrating a vertical cross-section in one process showing a method of manufacturing the semiconductor memory device in accordance with the foregoing embodiment of the present invention.

As shown in FIG. 13, the polysilicon film 1204 in the bottoms of the memory holes 1101 is removed by RIE and spacers are formed on the side walls of the memory holes 1101.

Using these spacers 1301 as masks, the silicon dioxide film 1203, the silicon nitride film 1202 and the alumina film 1201 in portions other than the side walls of the memory holes 1101 are removed by RIE. Then, phosphorous is implanted by means of angled ion implantation on the condition of 5 keV/ 2×10$^{11}$ in the spacers 1301 from four directions.

Figure 14:
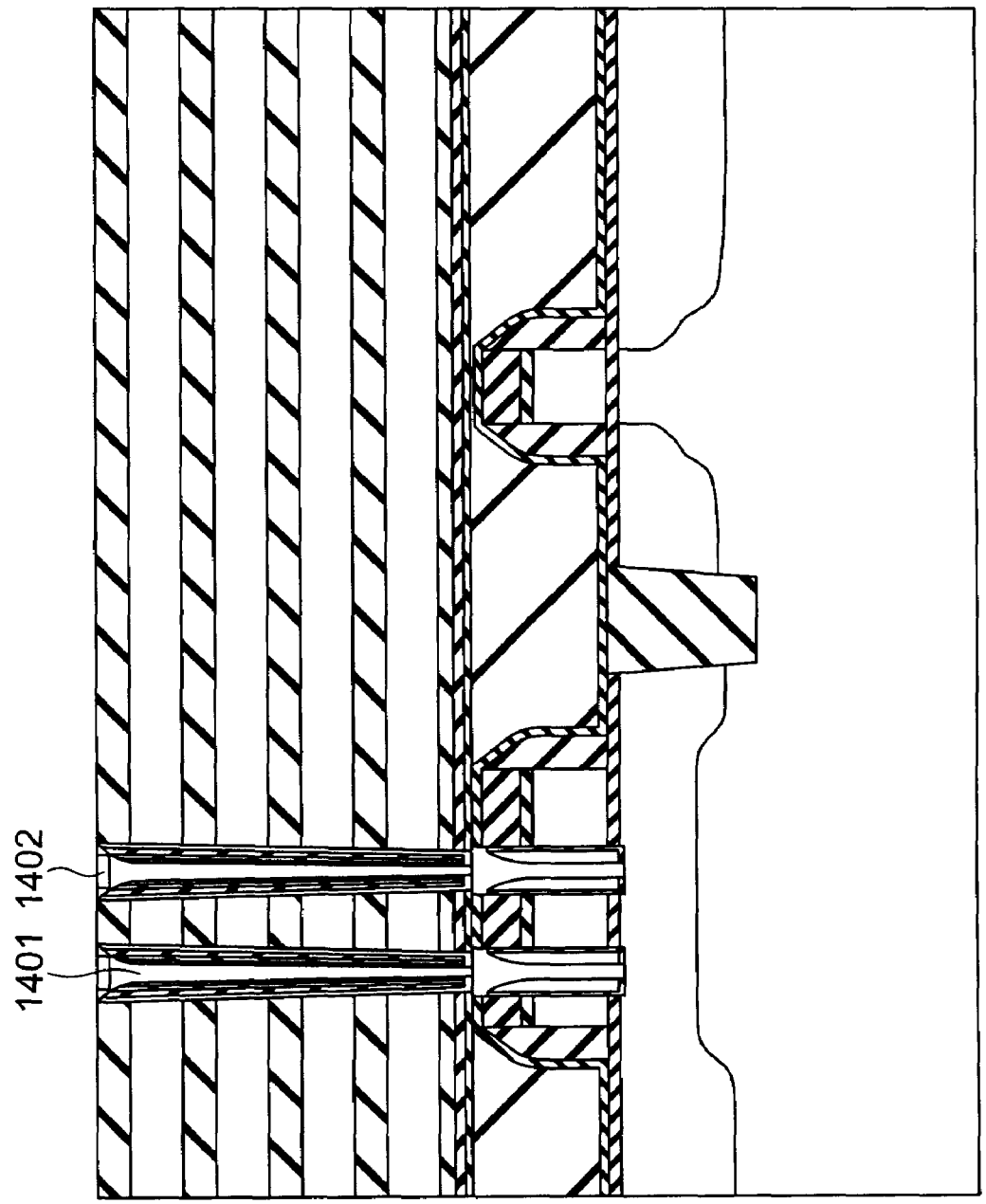
FIG. 14 is a schematic view illustrating a vertical cross-section in one process showing a method of manufacturing the semiconductor memory device in accordance with the foregoing embodiment of the present invention.

As shown in FIG. 14, after depositing and planarizing polysilicon 1401 to serve as silicon bodies, arsenic is implanted on the condition of 40 keV/3×10$^{15}$ to form drain diffused layers 1402, and the diffused layers 1402 are activated using a 960° C./10 sec RTA process.

Figure 15A:
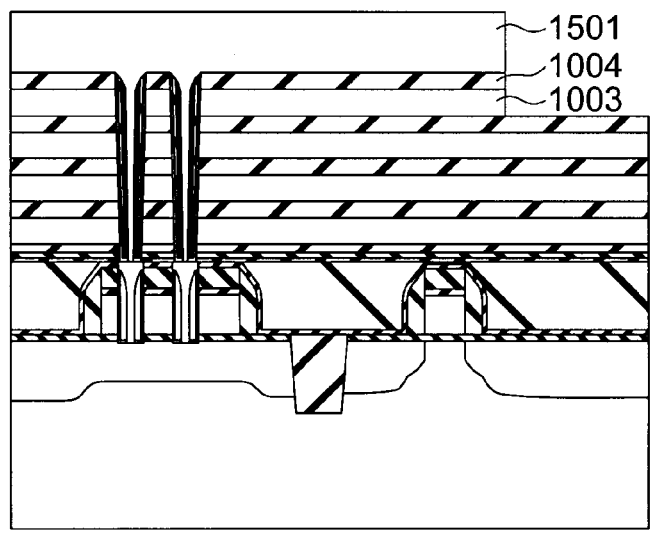
FIG. 15A is a schematic view illustrating a vertical cross-section in one process showing a method of manufacturing the semiconductor memory device in accordance with the foregoing embodiment of the present invention.

As shown in FIG. 15A, a 3 μm-thick resist 1501 is applied and patterned into the shape of word lines in the undermost layer of each memory array, and the first layer (uppermost layer) of the laminated structure composed of the polysilicon films 1003 and the silicon dioxide films 1004 is RIE-processed.

Figure 15B:
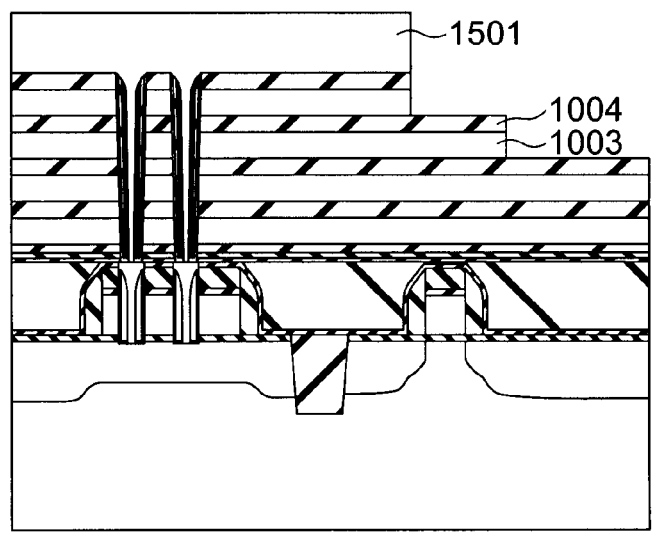
FIG. 15B is a schematic view illustrating a vertical cross-section in one process showing a method of manufacturing the semiconductor memory device in accordance with the foregoing embodiment of the present invention.
Figure 15C:
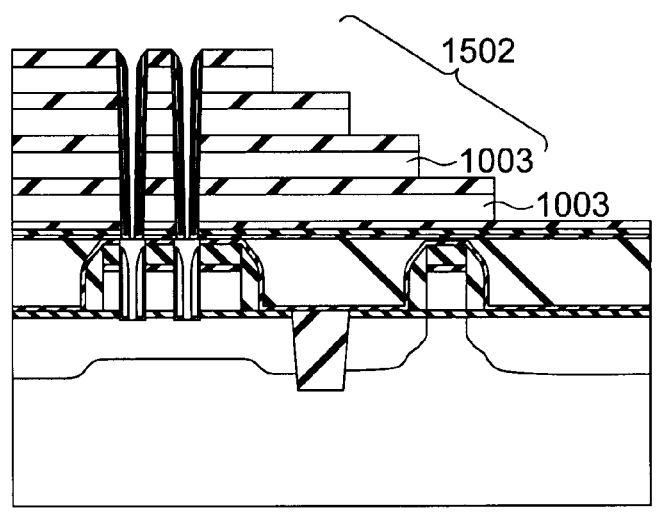
FIG. 15C is a schematic view illustrating a vertical cross-section in one process showing a method of manufacturing the semiconductor memory device in accordance with the foregoing embodiment of the present invention.

As shown in FIG. 15B, the resist 1501 is slimmed (the resist pattern is made narrower) and the first and second layers are RIE-processed. This resist slimming and the RIE processing of the laminated structure composed of the polysilicon films 1003 and the silicon dioxide films 1004 are repeated to form such a step structure 1502 as shown in FIG. 15C. This structure is used in order to form contact vias in the polysilicon film 1003 of each layer.

Figure 16:
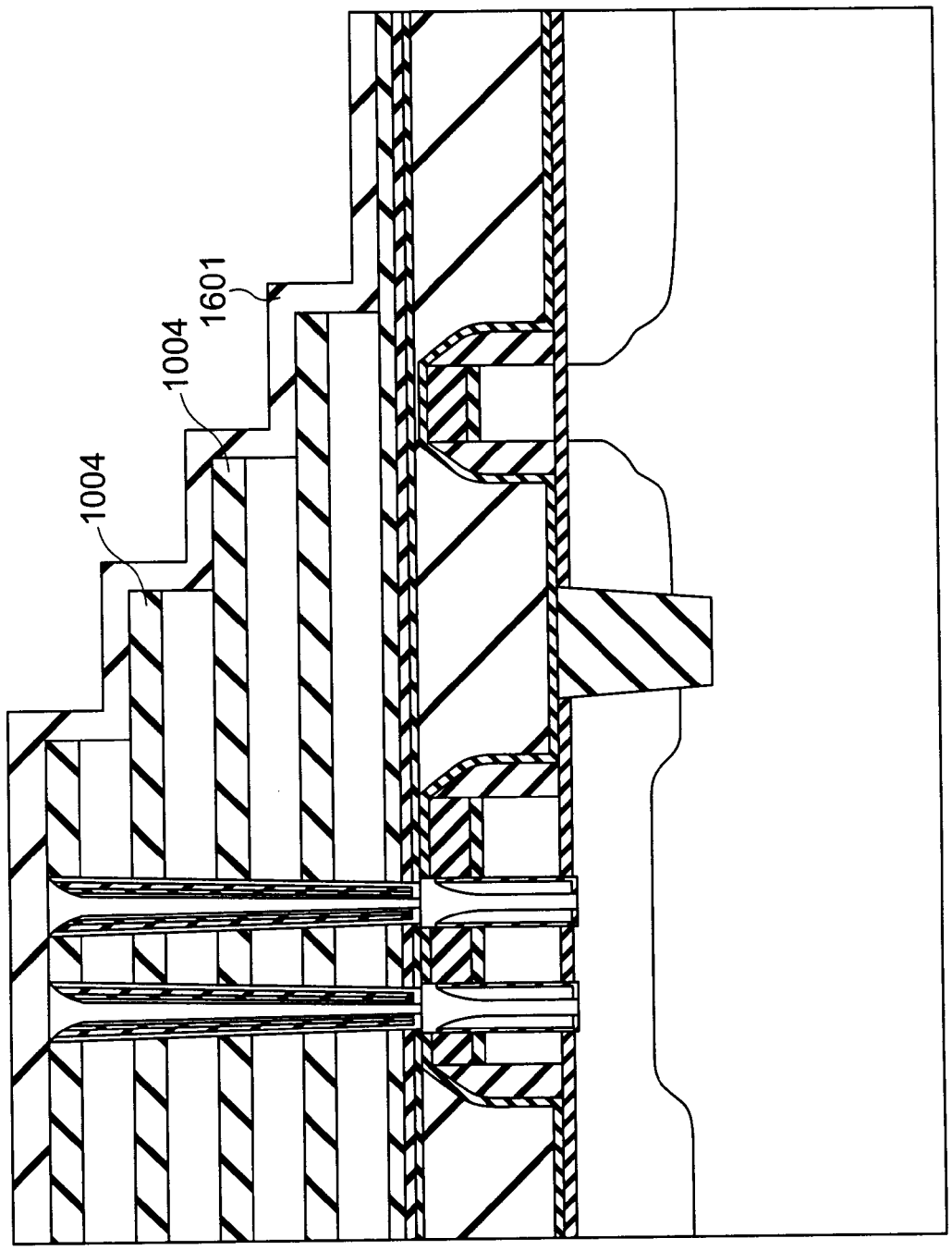
FIG. 16 is a schematic view illustrating a vertical cross-section in one process showing a method of manufacturing the semiconductor memory device in accordance with the foregoing embodiment of the present invention.

As shown in FIG. 16, a stopper silicon nitride film 1601 is deposited on the silicon dioxide films 1004.

Figure 17:
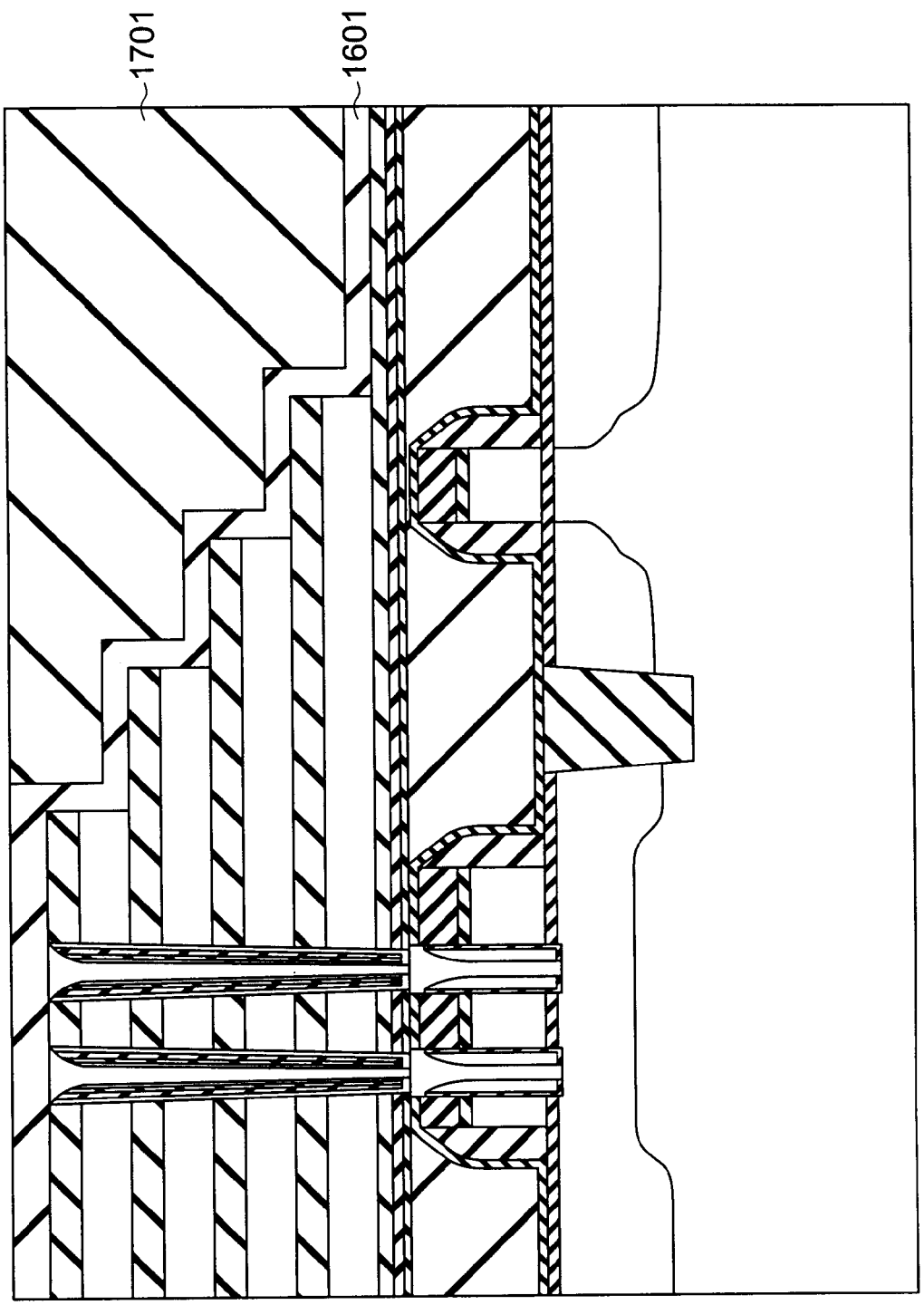
FIG. 17 is a schematic view illustrating a vertical cross-section in one process showing a method of manufacturing the semiconductor memory device in accordance with the foregoing embodiment of the present invention.

As shown in FIG. 17, an interlayer insulating film 1701 is deposited on the stopper silicon nitride film 1601 and is planarized by means of chemical mechanical polishing (CMP).

Figure 18:
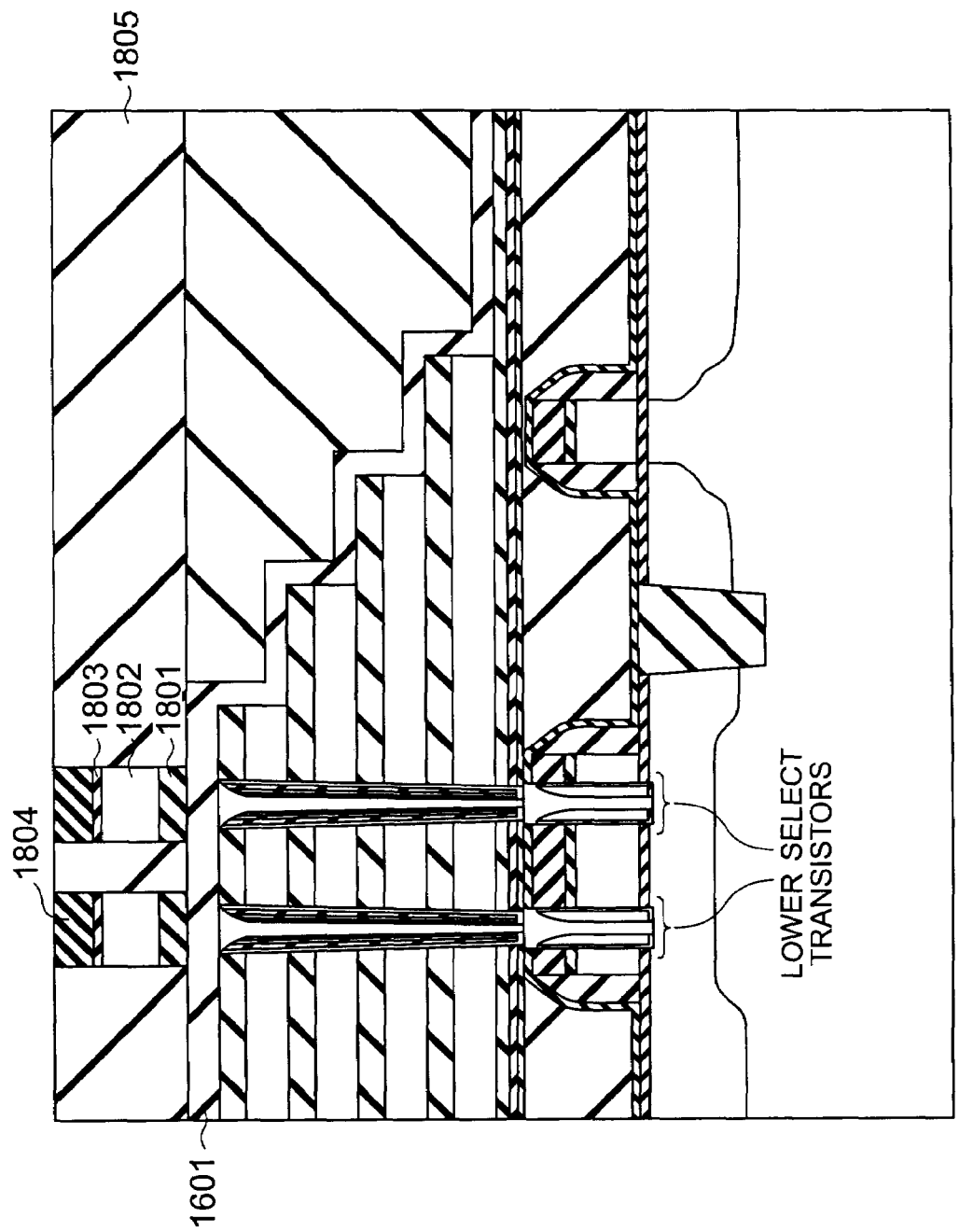
FIG. 18 is a schematic view illustrating a vertical cross-section in one process showing a method of manufacturing the semiconductor memory device in accordance with the foregoing embodiment of the present invention.

As shown in FIG. 18, a 50 nm-thick silicon dioxide film 1801, a 150 nm-thick polysilicon film 1802, a 20 nm-thick TEOS film 1803 and a 100 nm-thick silicon nitride film 1804 are deposited on the silicon dioxide film 1601 and are patterned so as to correspond to the lower select transistors. Then, an interlayer insulating film 1805 is deposited and planarized.

Figure 19:
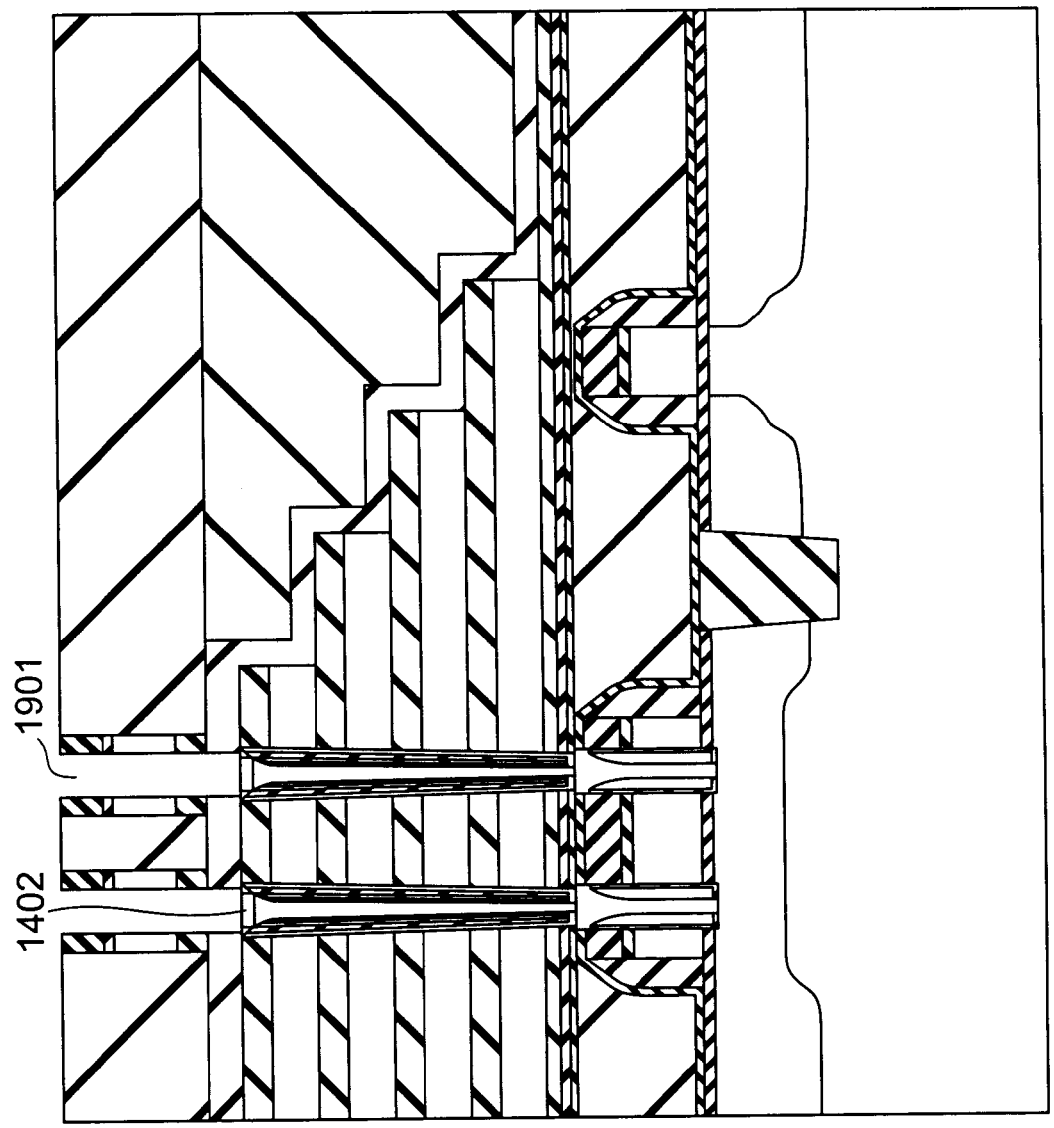
FIG. 19 is a schematic view illustrating a vertical cross-section in one process showing a method of manufacturing the semiconductor memory device in accordance with the foregoing embodiment of the present invention.

As shown in FIG. 19, holes 1901 for exposing the drain diffused layers 1402 are created by RIE in a matrix shape.

Figure 20:
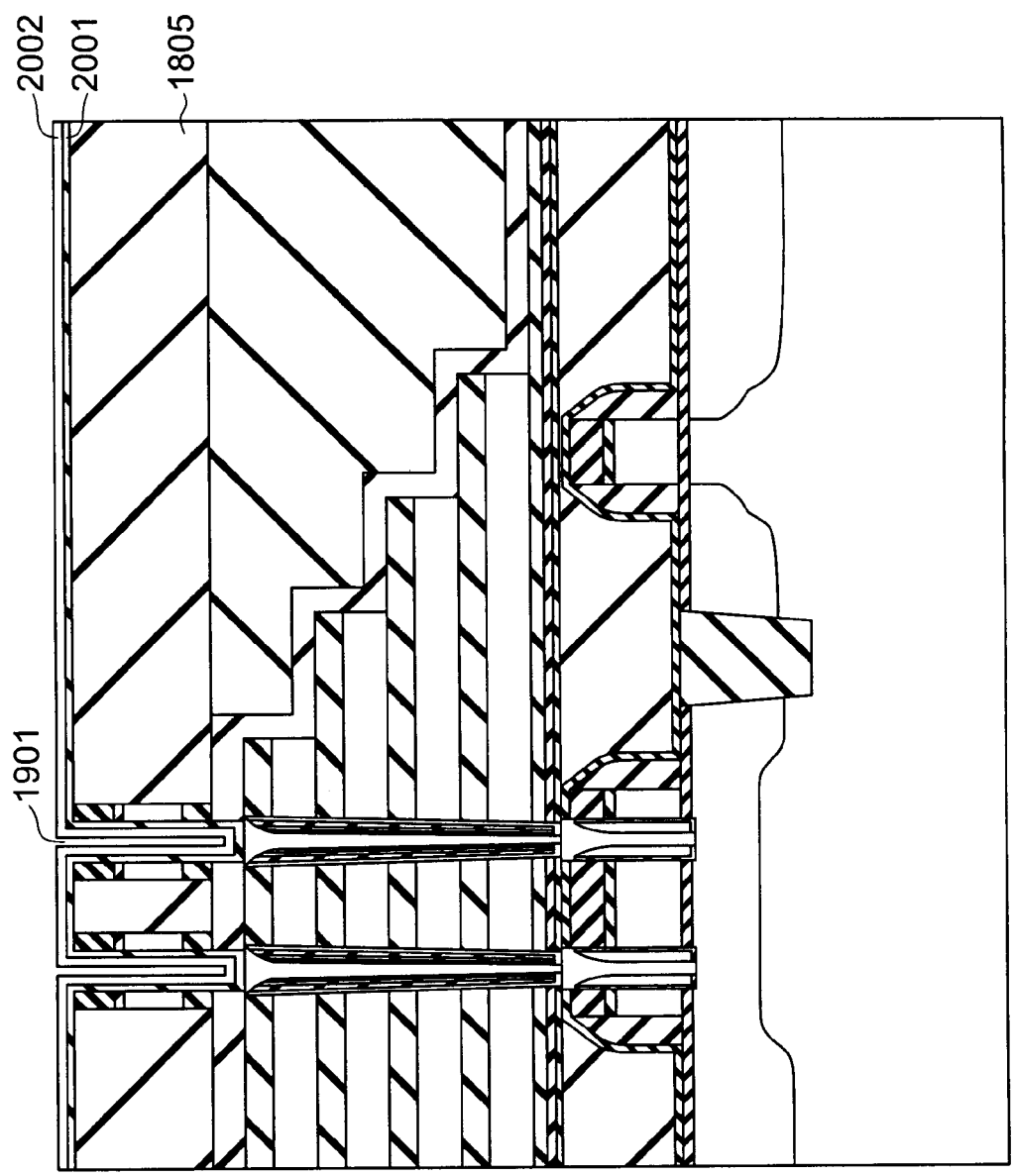
FIG. 20 is a schematic view illustrating a vertical cross-section in one process showing a method of manufacturing the semiconductor memory device in accordance with the foregoing embodiment of the present invention.

As shown in FIG. 20, a silicon dioxide film 2001 and an amorphous silicon film 2002 are deposited on the inner walls of the holes 1901 and on the interlayer insulating film 1805.

Figure 21:
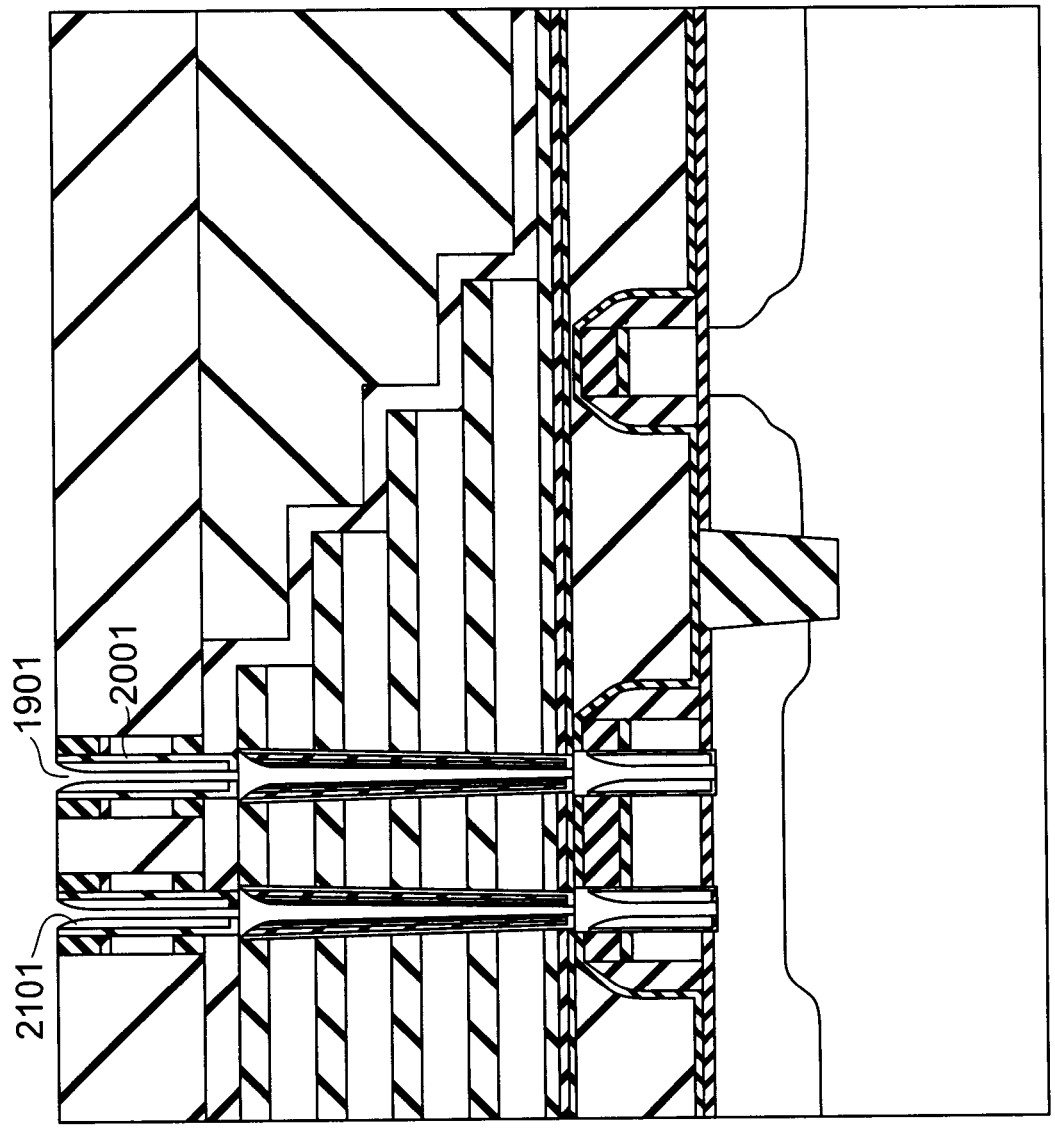
FIG. 21 is a schematic view illustrating a vertical cross-section in one process showing a method of manufacturing the semiconductor memory device in accordance with the foregoing embodiment of the present invention.

As shown in FIG. 21, the amorphous silicon film 2002 is etched to form spacers 2101 and, in addition, the silicon dioxide film 2001 is etched. Because of the presence of the spacers 2101, the silicon dioxide film 2001 in the bottoms of the holes 1901 are removed. Parts of the silicon dioxide film 2001 left over on the side walls of the holes 1901 serve as gate-insulating films.

Figure 22:
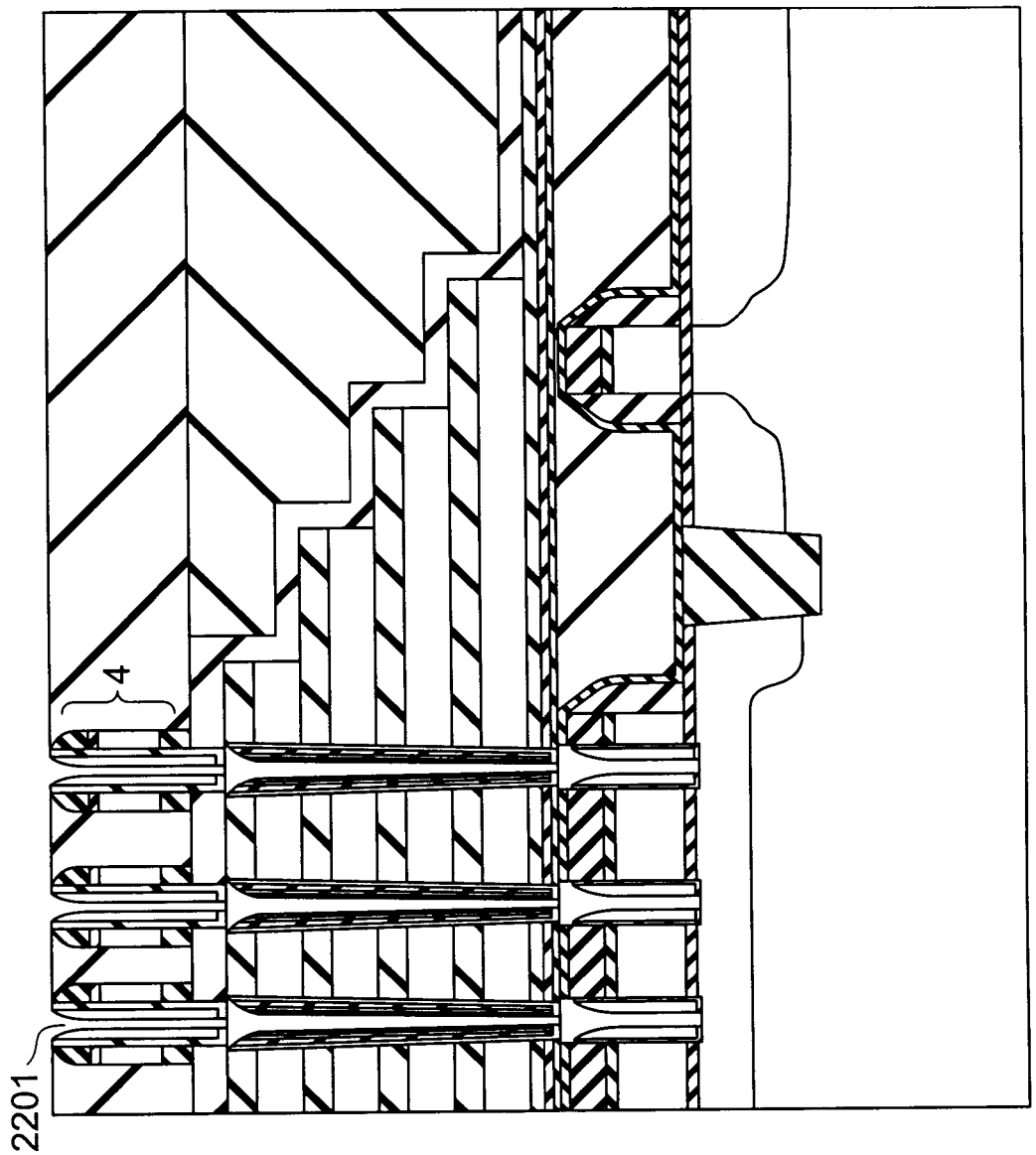
FIG. 22 is a schematic view illustrating a vertical cross-section in one process showing a method of manufacturing the semiconductor memory device in accordance with the foregoing embodiment of the present invention.

As shown in FIG. 22, polysilicon 2201 to serve as bodies is deposited and planarized, channel ion implantation (phosphorous is implanted on the condition of the acceleration voltages being 220 keV, 250 keV and 280 keV and the dosage being 5e11 cm$^{-2}$ at a time) is carried out, and arsenic is implanted on the condition of 40 keV/3e15 to form drain-side diffused layers. Then, the impurities are activated using a 960° C./10 sec RTA process to form dummy transistors 4.

Figure 23:
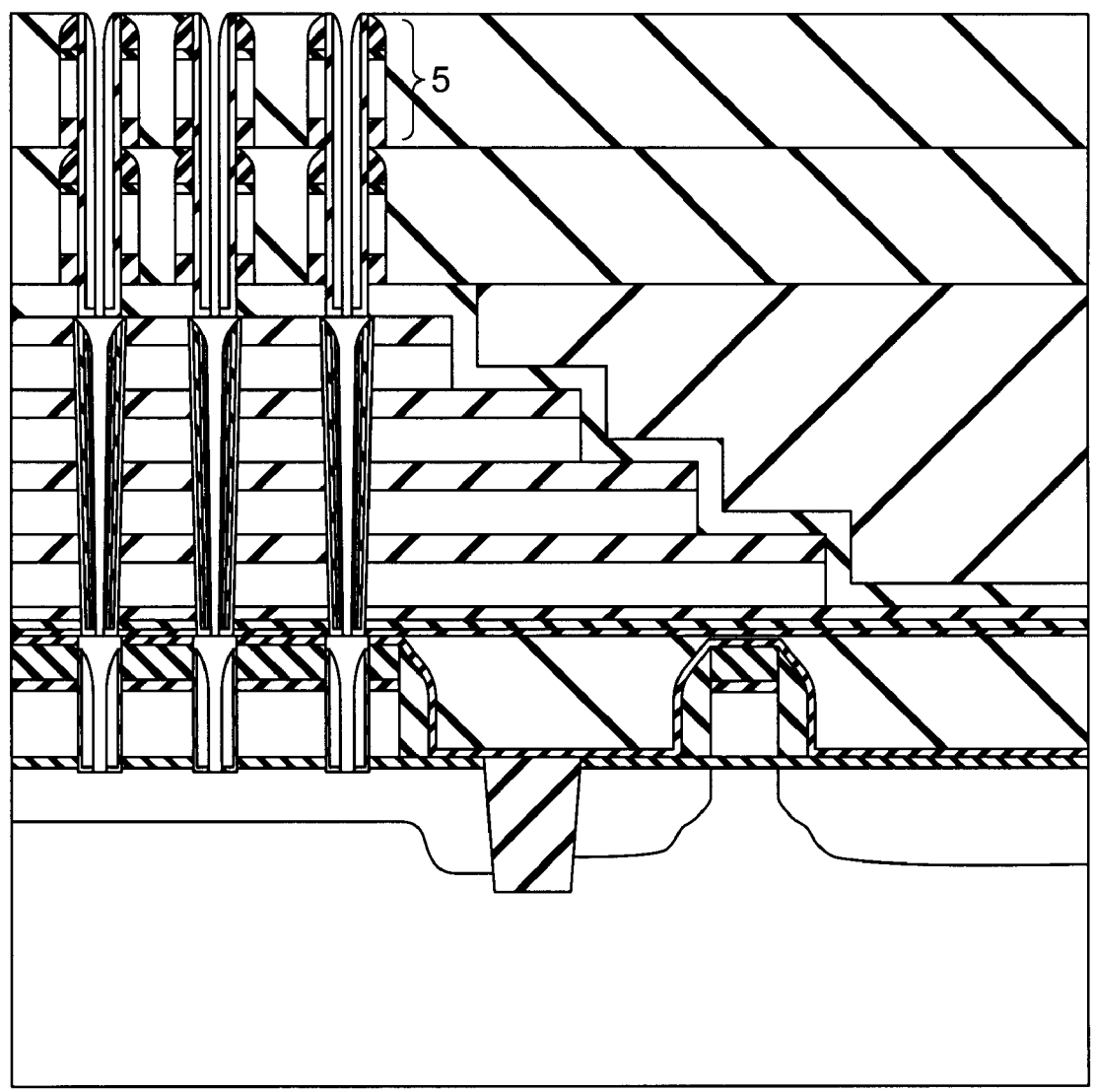
FIG. 23 is a schematic view illustrating a vertical cross-section in one process showing a method of manufacturing the semiconductor memory device in accordance with the foregoing embodiment of the present invention.

As shown in FIG. 23, the upper select transistors 5 are formed on the dummy transistors 4 in the same way as the above-described dummy transistors are formed.

Figure 24:
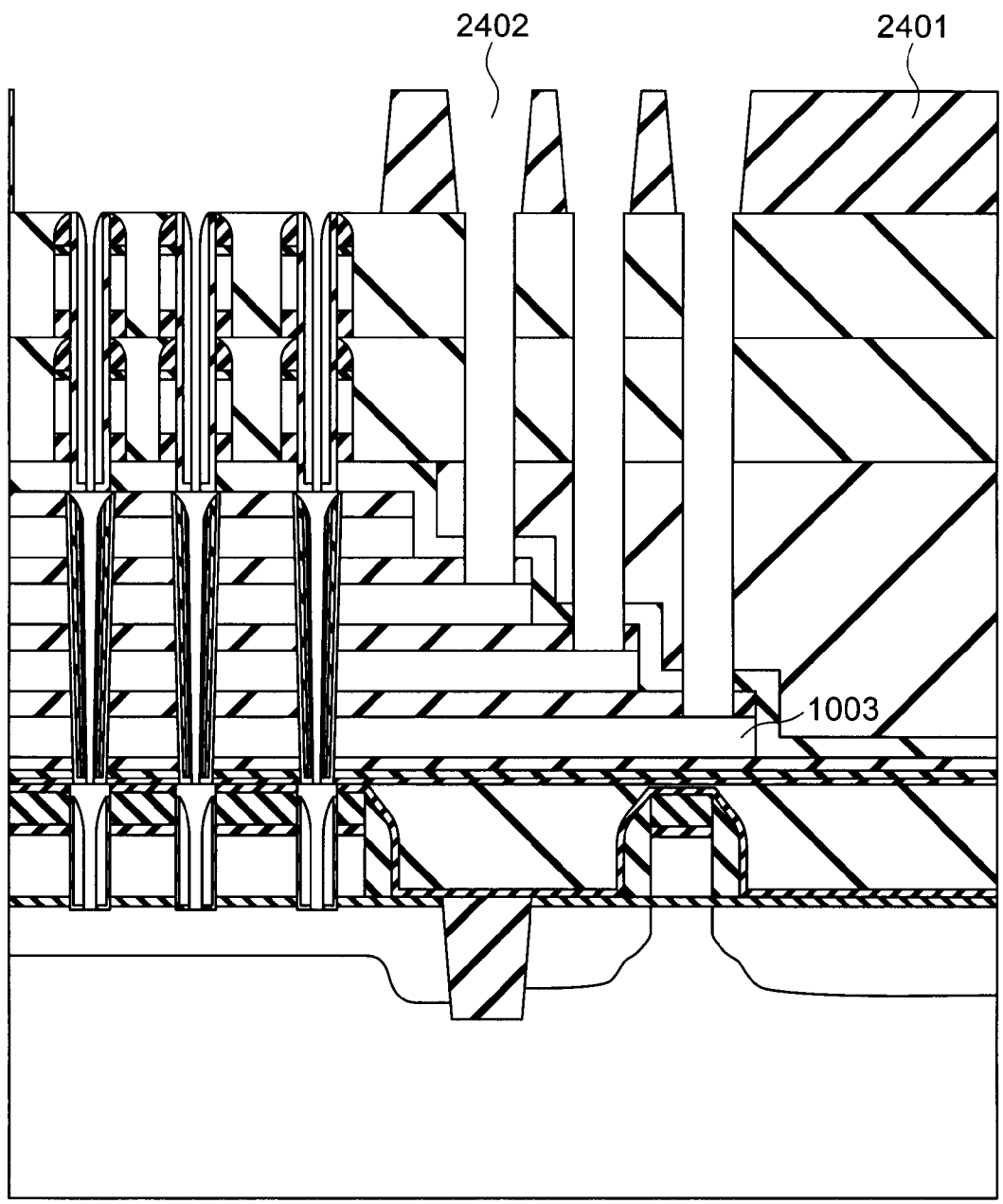
FIG. 24 is a schematic view illustrating a vertical cross-section in one process showing a method of manufacturing the semiconductor memory device in accordance with the foregoing embodiment of the present invention.

As shown in FIG. 24, an insulating film 2401 is deposited and contact vias 2402 for connection with the polysilicon film 1003 of each layer and with the select transistors 5 are created.

Figure 25:
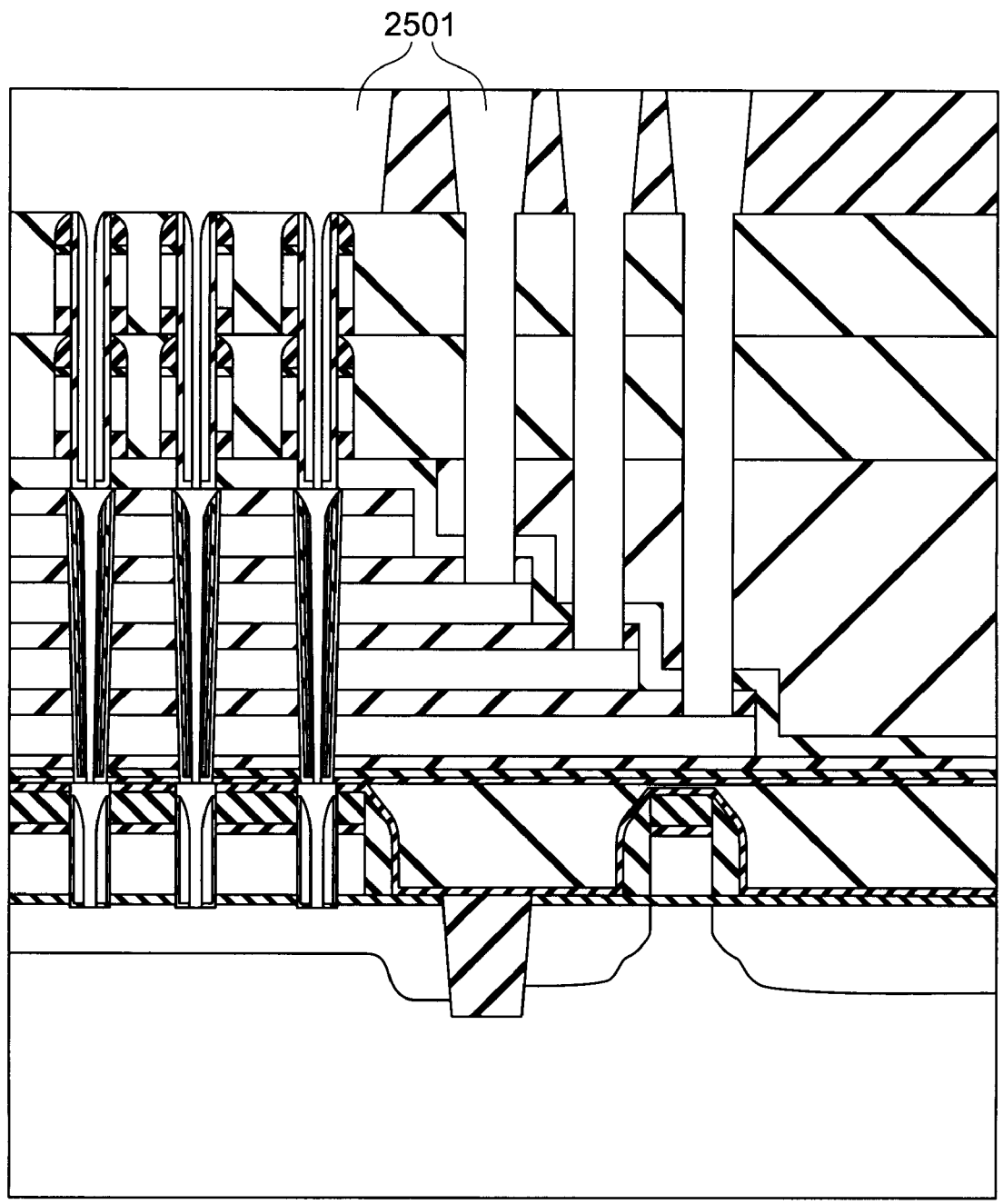
FIG. 25 is a schematic view illustrating a vertical cross-section in one process showing a method of manufacturing the semiconductor memory device in accordance with the foregoing embodiment of the present invention.

As shown in FIG. 25, wiring lines 2501 are formed so as to fill the contact vias 2402.

In the semiconductor memory device manufactured in such a manner as described above, it is possible to reduce leak currents in the lower select transistors 2 and prevent a drop in the body potential, thereby preventing miswriting, by turning off the lower select gates and the gate electrodes in the undermost layer of each memory array and trapping holes within these gate electrodes at the time write operation to write data 1.

Likewise, the dummy transistors 4 make it possible to reduce leak currents in the upper select transistors 5 and, therefore, prevent miswriting. In addition, it is possible to efficiently raise the body potential at the time of erase operation.

COMPARATIVE EXAMPLES

Figure 26:
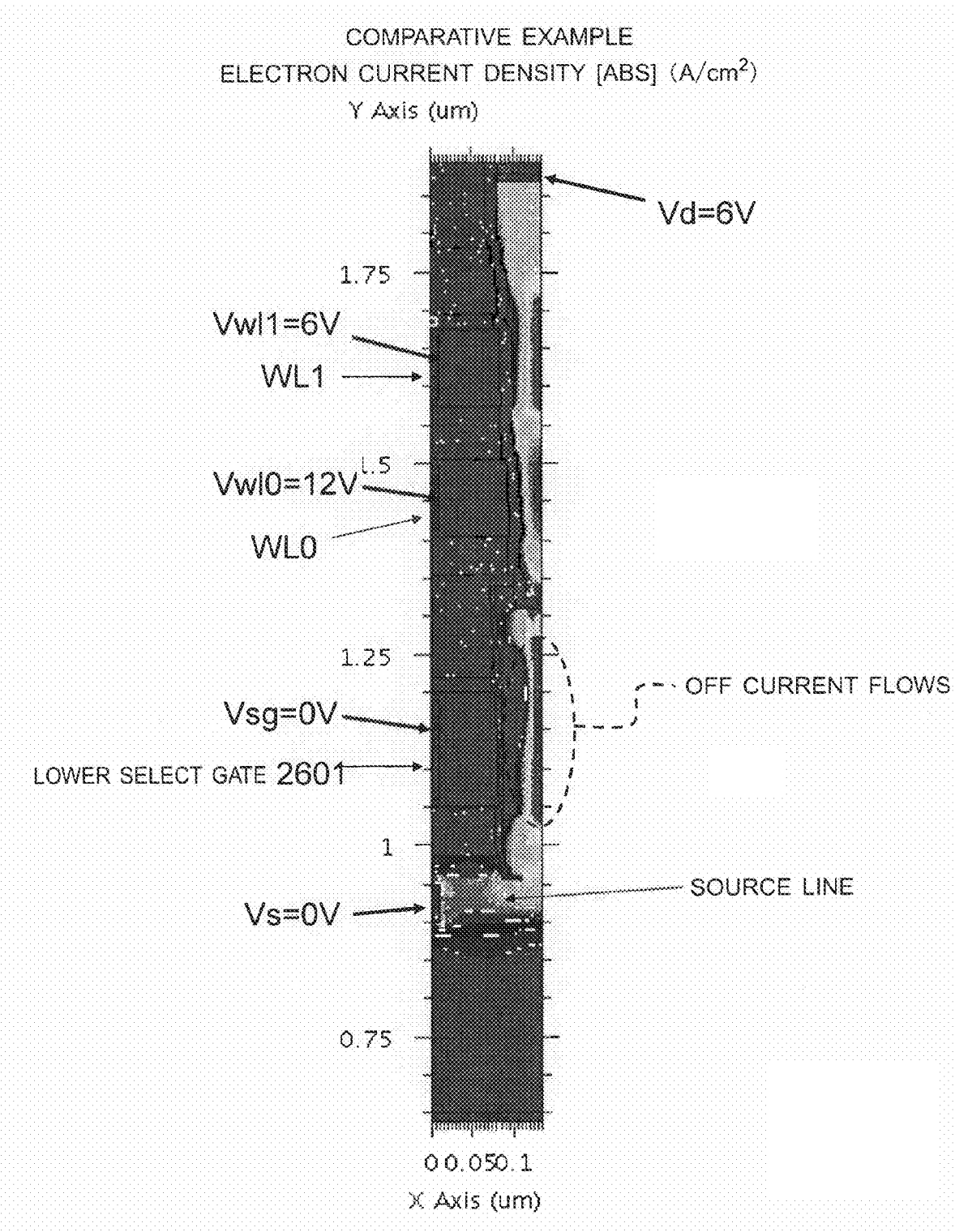
FIG. 26 is a graphical view illustrating the result of simulating an electron current distribution at the time of data write operation in a semiconductor memory device in accordance with a comparative example.

FIG. 26 shows the result of simulating an electron current distribution when writing data 1 using a semiconductor memory device in accordance with a comparative example. In the semiconductor memory device in accordance with the comparative example, electrodes in the undermost layer of each memory array also function as data storage elements (memory cell transistors) and corresponding word lines WL0 are connected to word line drivers.

It should be assumed here that in order to write data 1 to memory cell transistors corresponding to the word lines WL0, a Vpass potential of 6 V has been applied to word lines WL1, a Vprog potential of 12 V has been applied to the word lines WL0, a source line potential Vs has been raised to 0 V, and a body potential Vbody (drain voltage Vd) has been raised to 6 V. In this case, it is understood that an off current is still flowing even if the gate potential Vsg of lower select gates 2601 are set to 0 V.

Figure 27:
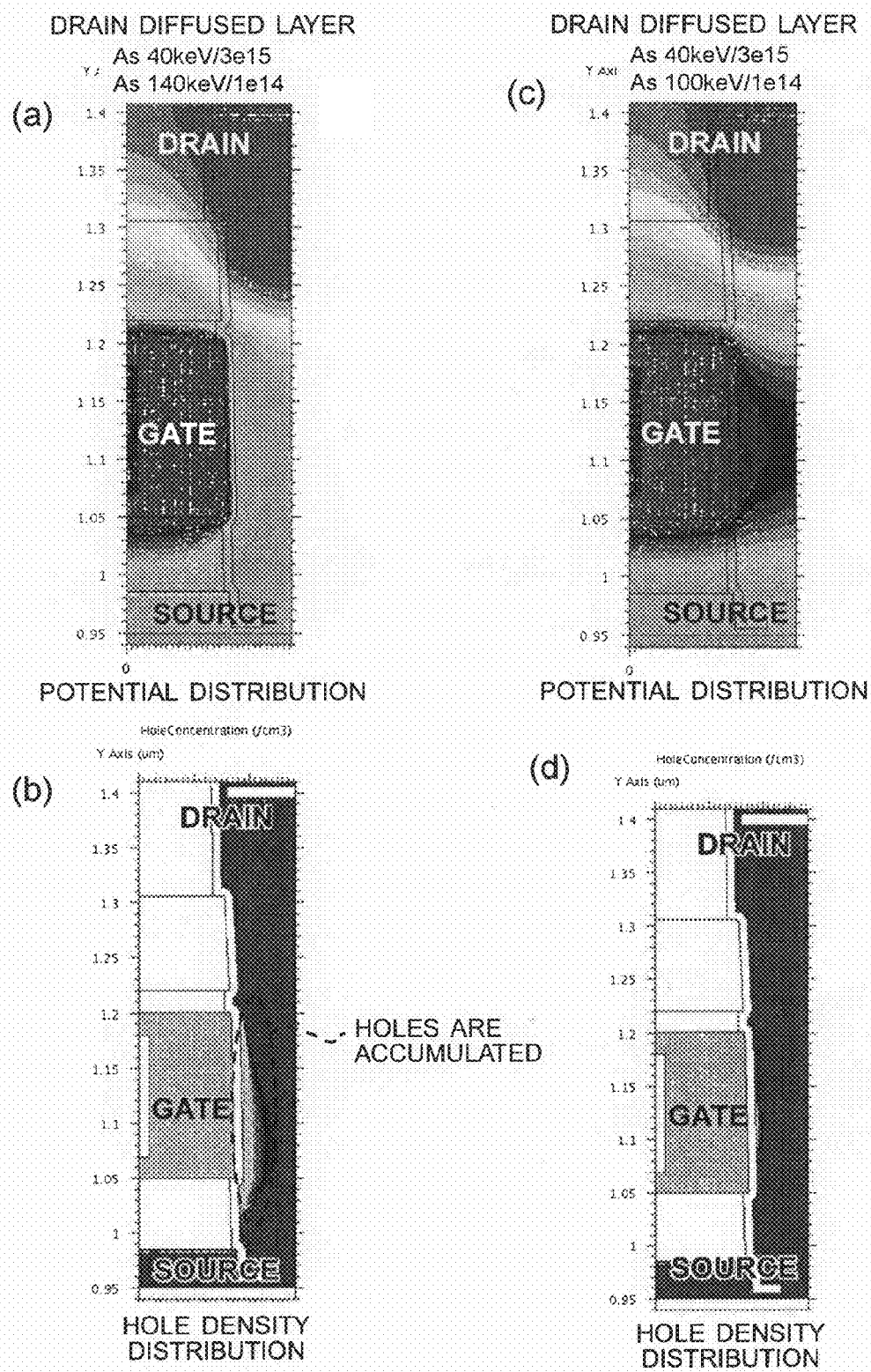
FIG. 27 is a graphical view illustrating the relationship between the impurity concentration of a diffused layer and the state of hole accumulation.

FIG. 27 shows the potential distribution and the hole density distribution of the impurity concentration of a drain diffused layer when the drain voltage and the gate voltage of a transistor is respectively set to 3 V and 0 V (in off state).

As shown in FIGS. 27(A) and 27(B), transistors cannot be turned off since holes are accumulated immediately underneath the gates of the transistors if the impurity concentration thereof is high. Transistors can be turned off, however, as shown in FIGS. 27(C) and 27(D), since holes are not accumulated if the impurity concentration is low. It is thus understood that the impurity concentration affects the occurrence of band-to-band tunneling.

Figure 28:
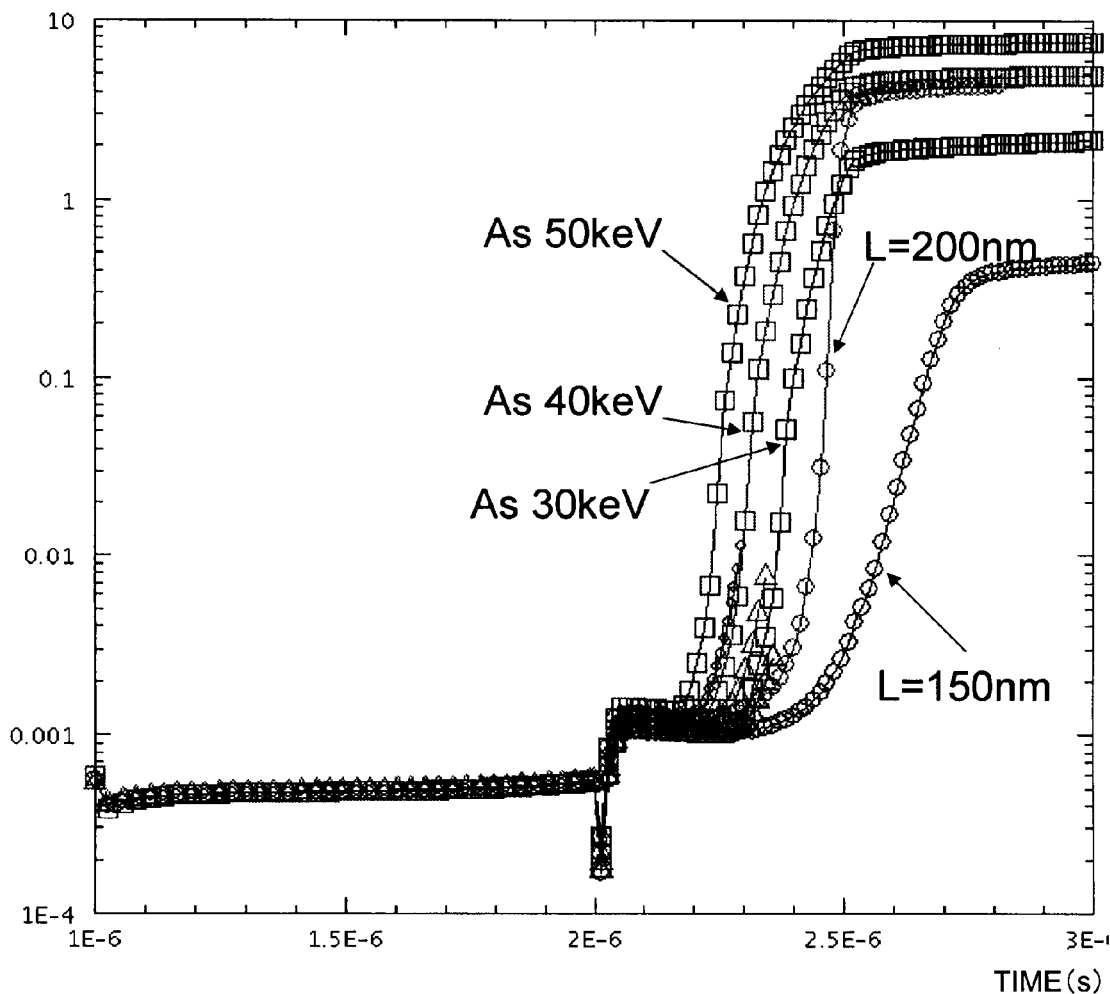
FIG. 28 is a graphical view illustrating the result of simulating a change in drain current at the time of data write operation in a semiconductor memory device in accordance with a comparative example.

FIG. 28 shows a change in the drain current when the Vprog potential was raised from 0 V to 12 V 2 µs after the Vpass potential at the time of writing data 1 was raised in a case where a change was made to the gate length L of the semiconductor memory device in accordance with the above-described comparative example and to the conditions of ion implantation into the drain diffused layers of the semiconductor memory device. It is understood that as the Vprog potential is stepped up (time lapse), the drain current becomes extremely large, i.e., the drain voltage (body potential Vbody) becomes extremely high. This means that a hole current due to band-to-band tunneling becomes large.

As a result, electric fields generated by the lower select gate electrodes are shielded, thereby causing an off current to flow through the center of each body and preventing the lower select transistors from being turned off. Elongating the gate length causes the drain voltage to become higher. The figure also shows the results of changing the conditions of ion implantation into the drain diffused layers to 30 keV/3×10$^{15}$, 40 keV/3×10$^{15}$ and 50 keV/3×10$^{15}$. No satisfactory improvements were confirmed, however, even if the conditions of ion implantation were changed.

Figure 29:
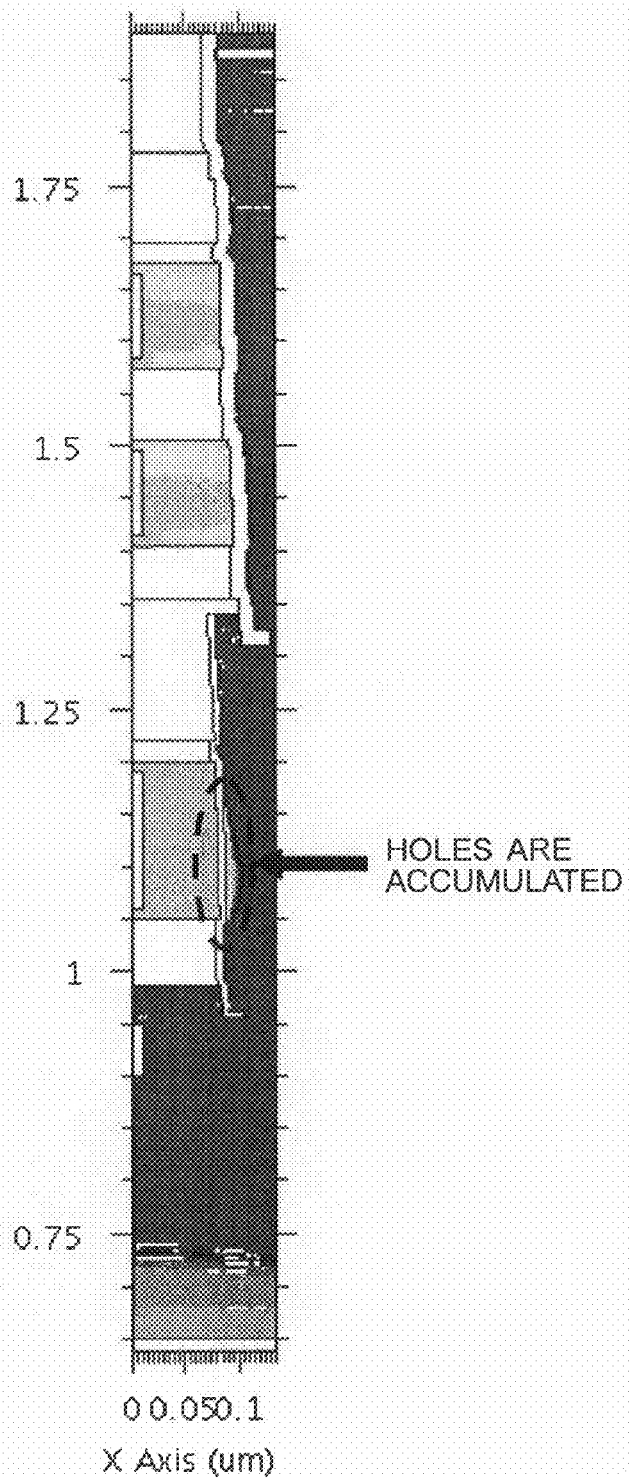
FIG. 29 is a graphical view illustrating the result of simulating a hole density distribution at the time of data write operation in a semiconductor memory device in accordance with a comparative example.

FIG. 29 shows a hole density distribution at this point. It is understood that holes are accumulated in silicon bodies immediately underneath the select gates. Hole accumulation causes an off current to flow, thereby making it impossible to turn off the select transistors.

Figure 30:
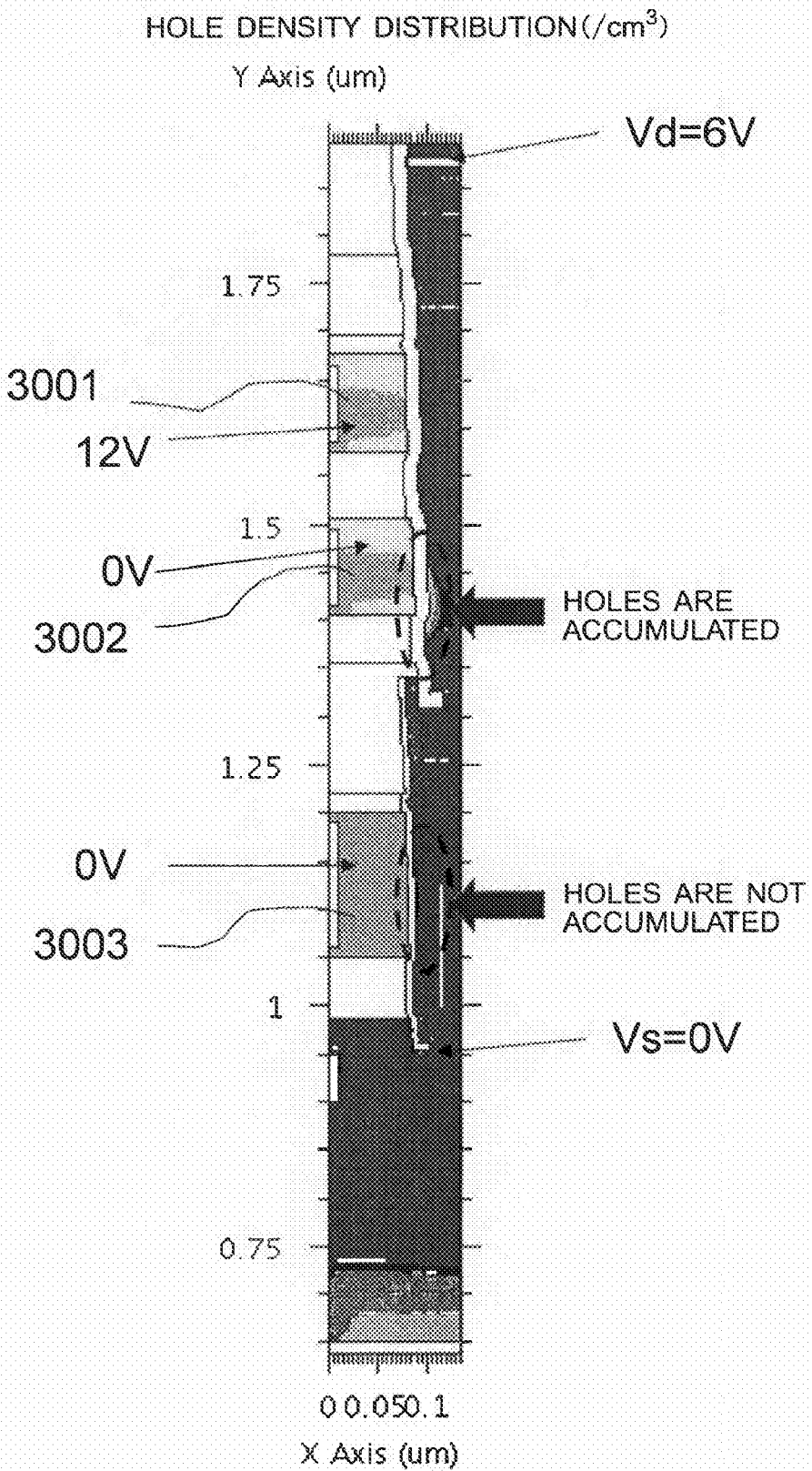
FIG. 30 is a graphical view illustrating the result of simulating a hole density distribution at the time of data write operation in a semiconductor memory device in accordance with an embodiment of the present invention.

FIG. 30 shows the result of simulating a hole density distribution at the time of writing data 1 using the semiconductor memory device in accordance with the present embodiment. It should be assumed here that a Vprog potential of 12 V has been applied to the gate electrode 3001 of memory cell transistors to be written with data 1, 0 V has been applied to the lower dummy gate electrode 3002 and the lower select gate electrode 3003, the source line potential Vs has been raised to 0 V, and the body potential Vbody (drain voltage Vd) has been raised to 6 V.

It is understood that holes are accumulated in the silicon body immediately underneath the lower dummy gate electrode 3002 and that holes are not accumulated in the silicon body immediately underneath the lower select gate electrode 3003. Accordingly, leak currents are prevented from being generated in the lower select transistors and thus a drop in the body potential is prevented, thereby making it possible to prevent miswriting.

Figure 31:
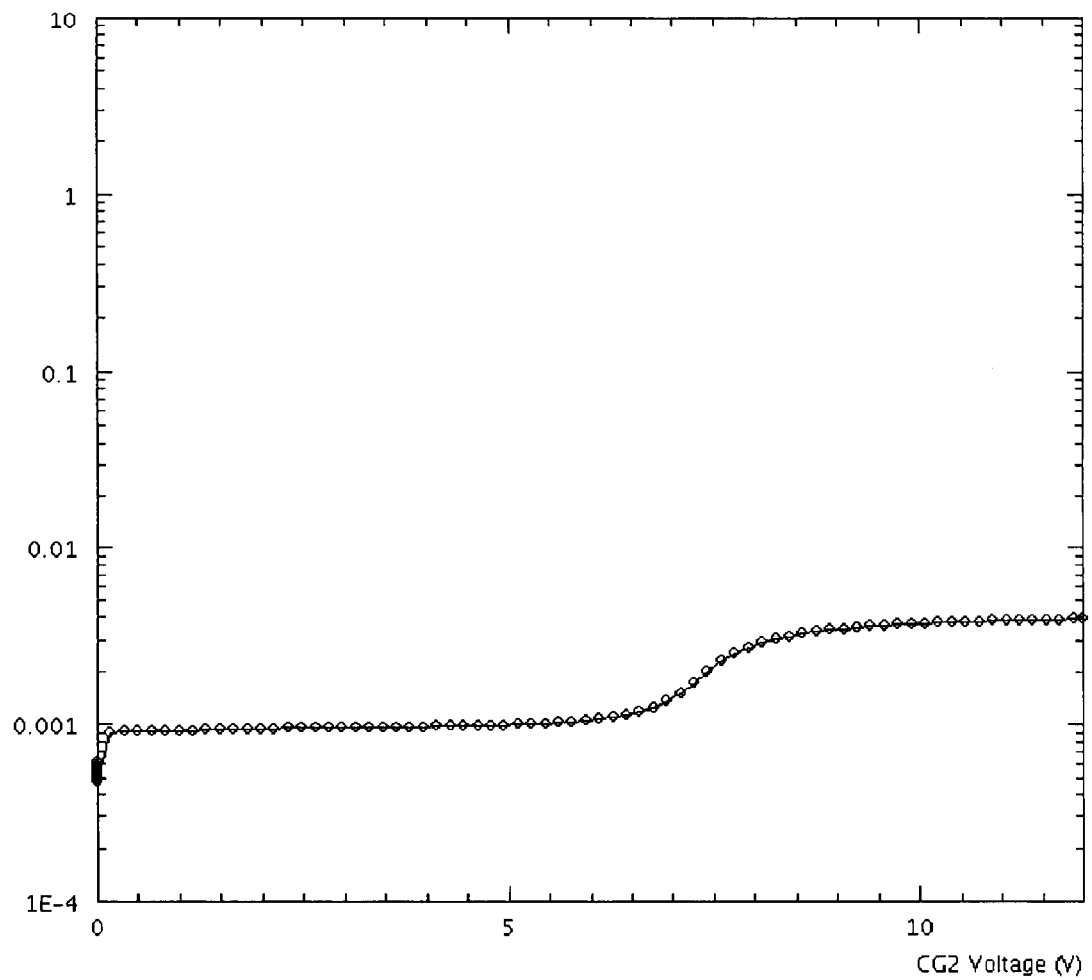
FIG. 31 is a graphical view illustrating the result of simulating a change in drain current at the time of data write operation in the semiconductor memory device in accordance with the foregoing embodiment of the present invention.

FIG. 31 shows a change in the drain current when the Vprog potential is stepped up from 0 V to 12 V. It is understood that the drain current does not increase largely along with a rise in the Vprog potential and that a leak current is suppressed.

As described above, using the semiconductor memory device in accordance with the present embodiment, it is possible to efficiently raise the body potential by a hole current at the time of erase operation and suppress the occurrence of leak currents due to band-to-band tunneling at the lower select transistors at the time of write operation to write data 1, thereby preventing miswriting.

In the above-described embodiment, it is also acceptable to make the gate electrodes in the uppermost layer of each memory array 3 function as upper dummy gate electrodes, without forming the dummy transistors 4. In this case, the gate electrodes of memory cell transistors in the uppermost layer of each memory array 3 are connected to the select gate driver 21.

Furthermore, it is also acceptable to form dummy transistors between the lower select transistors 2 and the memory arrays 3, and connect the gate electrodes of these dummy transistors to the drivers 23 so as to function as lower dummy gate electrodes.

Materials used in the above-described embodiment are mentioned only by way of example and, therefore, amorphous silicon may be changed to polysilicon and polysilicon may be changed to amorphous silicon.

What is claimed is:

1. A semiconductor memory device comprising:
    a semiconductor substrate;
    first select transistors formed on the surface of said semiconductor substrate;
    first dummy transistors formed above said first select transistors;
    a plurality of memory cell transistors formed above said first dummy transistors so as to extend in a direction perpendicular to the surface of said semiconductor substrate, each of said memory cell transistor including an insulating layer having a charge-accumulating function;
    second dummy transistors formed above said memory cell transistors; and
    second select transistors formed above said second dummy transistors; wherein a first potential is provided to the gate electrodes of said first select transistors and the gate electrodes of said first dummy transistors and a second potential is provided to the gate electrodes of said second select transistors and the gate electrodes of said second dummy transistors at the time of write operation to write data to said memory cell transistors.

2. The semiconductor memory device according to claim 1, wherein at least either said first dummy transistors or said second dummy transistors include insulating layers having a charge-accumulating function.

3. The semiconductor memory device according to claim 1, wherein each of said first select transistors includes:
    a source line-side diffused layer formed on the surface of said semiconductor substrate;
    a first insulating layer formed on said semiconductor substrate;
    a gate electrode formed on said first insulating layer;
    a second insulating layer formed on said gate electrode;
    a body portion connected to said source line-side diffused layer and penetrating through said first insulating layer, said gate electrode and said second insulating layer;
    a gate-insulating film formed between said body portion and said gate electrode so as to surround said body portion; and
    a bit line-side diffused layer formed on the surface of said body portion.

4. The semiconductor memory device according to claim 1, wherein the impurity concentrations of the source line-side diffused layer of each of said first select transistors and the bit line-side diffused layer of each of said second select transistors are higher than the impurity concentration of the diffused layer of each of said second dummy transistors on the side of said memory cell transistors.

5. The semiconductor memory device according to claim 1, wherein the impurity concentrations of the source line-side diffused layer of each of said first select transistors and the bit line-side diffused layer of each of said second select transistors are higher than the impurity concentration of a diffused layer between each of said second dummy transistors and each of said second select transistors.

6. The semiconductor memory device according to claim 1, wherein the gate electrodes of each of said first dummy transistors and each of said second dummy transistors are set to a floating potential at the time of data erase operation on said memory cell transistors.

7. A method of driving a semiconductor memory device comprising a semiconductor substrate; first select transistors formed on the surface of said semiconductor substrate; first dummy transistors formed above said first select transistors; a plurality of memory cell transistors formed above said first dummy transistors so as to extend in a direction perpendicular to the surface of said semiconductor substrate, each of said memory cell transistor including an insulating layer having a charge-accumulating function; second dummy transistors formed above said memory cell transistors; and second select transistors formed above said second dummy transistors; wherein a first potential is provided to the gate electrodes of said first select transistors and the gate electrodes of said first dummy transistors and a second potential is provided to the gate electrodes of said second select transistors and the gate electrodes of said second dummy transistors at the time of data write operation.

8. The method of driving a semiconductor memory device according to claim 7, wherein the gate electrodes of said first dummy transistors and said second dummy transistors are set to a floating potential at the time of data erasure.

9. The method of driving a semiconductor memory device according to claim 7, wherein said first select transistors, said first dummy transistors, said second select transistors and said second dummy transistors are turned on by providing a third potential to the gate electrodes thereof at the time of data readout.

10. A memory system comprising:
    a storage portion including a semiconductor substrate; first select transistors formed on the surface of said semiconductor substrate; first dummy transistors formed above said first select transistors; a plurality of memory cell transistors formed above said first dummy transistors so as to extend in a direction perpendicular to the surface of said semiconductor substrate, each of said memory cell transistor including an insulating layer having a charge-accumulating function; second dummy transistors formed above said memory cell transistors; and second select transistors formed above said second dummy transistors;
    word line drivers for applying a voltage to the gate electrodes of said plurality of memory cell transistors;
    drivers connected to the gate electrodes of said first select transistors and the gate electrodes of said first dummy transistors to provide the same potential to the gate electrodes of said first select transistors and the gate electrodes of said first dummy transistors at the time of write operation to write data to said memory cell transistors; and
    a select gate driver connected to the gate electrodes of said second select transistors and the gate electrodes of said second dummy transistors to provide the same potential to the gate electrodes of said second select transistors and the gate electrodes of said second dummy transistors at the time of write operation to write data to said memory cell transistors.

11. The memory system according to claim 10, wherein said drivers set the gate electrodes of said first dummy transistors to a floating potential and said select gate driver sets the gate electrodes of said second dummy transistors to a floating potential at the time of data erase operation on said memory cell transistors.

12. The memory system according to claim 10, wherein at least either said first dummy transistors or said second dummy transistors include insulating layers having a charge-accumulating function.

13. The memory system according to claim 10, wherein each of said first select transistors includes:
 a source line-side diffused layer formed on the surface of said semiconductor substrate;
 a first insulating layer formed on said semiconductor substrate;
 a gate electrode formed on said first insulating layer;
 a second insulating layer formed on said gate electrode;
 a body portion connected to said source line-side diffused layer and penetrating through said first insulating layer, said gate electrode and said second insulating layer;
 a gate-insulating film formed between said body portion and said gate electrode so as to surround said body portion; and
 a bit line-side diffused layer formed on the surface of said body portion.

14. The memory system according to claim 10, wherein the impurity concentrations of the source line-side diffused layer of each of said first select transistors and the bit line-side diffused layer of each of said second select transistors are higher than the impurity concentration of the diffused layer of each of said second dummy transistors on the side of said memory cell transistors.

15. The memory system according to claim 10, wherein the impurity concentrations of the source line-side diffused layer of each of said first select transistors and the bit line-side diffused layer of each of said second select transistors are higher than the impurity concentration of a diffused layer between each of said second dummy transistors and each of said second select transistors.

16. The memory system according to claim 10, wherein said select gate driver includes:
 a PMOS transistor, one end of the source-drain path thereof being provided with a supply voltage and the other end being connected to the gate electrode of each of said second select transistors;
 a first NMOS transistor, one end of the source-drain path thereof being connected to the other end of the source-drain path of said PMOS transistor and the other end being grounded; and
 a second NMOS transistor, one end of the source-drain path thereof being connected to the other end of the source-drain path of said PMOS transistor and the other end being connected to the gate electrode of each of said second dummy transistors; wherein said second NMOS transistor turns on at the time of data write operation and at the time of data readout operation on said memory cell transistors.

17. The memory system according to claim 10, wherein said drivers include:
 a PMOS transistor, one end of the source-drain path thereof being provided with a supply voltage and the other end being connected to the gate electrode of each of said first select transistors;
 a first NMOS transistor, one end of the source-drain path thereof being connected to the other end of the source-drain path of said PMOS transistor and the other end being grounded; and
 a second NMOS transistor, one end of the source-drain path thereof being connected to the other end of the source-drain path of said PMOS transistor and the other end being connected to the gate electrode of each of said first dummy transistors; wherein said second NMOS transistor turns on at the time of data write operation and at the time of data readout operation on said memory cell transistors.

18. The memory system according to claim 16, further including decoders connected to the gate electrodes of said PMOS transistor and said first and second NMOS transistors to perform on/off control according to given address signals.

19. The memory system according to claim 17, further including decoders connected to the gate electrodes of said PMOS transistor and said first and second NMOS transistors to perform on/off control according to given address signals.

* * * * *